(12) United States Patent
Ahn et al.

(10) Patent No.: US 9,978,753 B2
(45) Date of Patent: May 22, 2018

(54) SEMICONDUCTOR DEVICE AND METHOD OF MANUFACTURING THE SAME

(71) Applicant: Samsung Electronics Co., Ltd., Suwon-si, Gyeonggi-do (KR)

(72) Inventors: Se-hyoung Ahn, Seoul (KR); Youn-soo Kim, Yongin-si (KR); Jae-hyoung Choi, Hwaseong-si (KR); Jae-wan Chang, Seoul (KR); Sun-min Moon, Yongin-si (KR); Jin-sun Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/410,488

(22) Filed: Jan. 19, 2017

(65) Prior Publication Data
US 2017/0352666 A1 Dec. 7, 2017

(30) Foreign Application Priority Data

Jun. 2, 2016 (KR) .......................... 10-2016-0068846

(51) Int. Cl.
*H01L 27/00* (2006.01)
*H01L 27/108* (2006.01)
*H01L 49/02* (2006.01)

(52) U.S. Cl.
CPC .. *H01L 27/10814* (2013.01); *H01L 27/10823* (2013.01); *H01L 27/10855* (2013.01); *H01L 27/10876* (2013.01); *H01L 27/10885* (2013.01); *H01L 27/10888* (2013.01); *H01L 28/90* (2013.01)

(58) Field of Classification Search
CPC ..................................................... H01L 28/56

USPC .................. 257/306, 307, 310, 532; 438/396
See application file for complete search history.

(56) References Cited

U.S. PATENT DOCUMENTS

| 7,297,975 | B2 * | 11/2007 | Ufert ...................... B82Y 10/00 257/2 |
| 7,473,565 | B2 * | 1/2009 | Arisumi .................. H01L 28/55 257/E21.009 |
| 7,514,315 | B2 | 4/2009 | Lee et al. |

(Continued)

FOREIGN PATENT DOCUMENTS

| KR | 10-0722772 | 5/2007 |
| KR | 10-0722989 | 5/2007 |

(Continued)

OTHER PUBLICATIONS

Xu, Wangying, "The role of solution-processed high-k gate dielectrics in electrical performance of oxide thin-films transistors", The Chinese University of Hong Kong, Journal of Materials Chemistry C, vol. 2, Feb. 17, 2016, pp. 5389-5396.

*Primary Examiner* — Mark Prenty
(74) *Attorney, Agent, or Firm* — Myers Bigel, P.A.

(57) ABSTRACT

A semiconductor device includes a lower electrode on a substrate, a capacitor dielectric layer on the lower electrode, and an upper electrode on the capacitor dielectric layer. The capacitor dielectric layer includes a base layer on the lower electrode and a dielectric particle layer in at least a portion of the base layer. The base layer includes a first dielectric material, and the dielectric particle layer extends at least partially continuously along a thickness direction of the capacitor dielectric layer and includes a second dielectric material different from the first dielectric material.

18 Claims, 40 Drawing Sheets

(56) References Cited

U.S. PATENT DOCUMENTS

| | | | |
|---|---|---|---|
| 7,531,405 B2 * | 5/2009 | Spitzer | ............... C23C 16/40 |
| | | | 438/171 |
| 7,616,426 B2 | 11/2009 | Kil et al. | |
| 7,835,134 B2 | 11/2010 | Kil et al. | |
| 8,420,552 B2 | 4/2013 | Takebayashi et al. | |
| 8,508,020 B2 | 8/2013 | Hirota et al. | |
| 8,896,097 B2 | 11/2014 | Wamura et al. | |
| 2009/0195962 A1 | 8/2009 | Lee et al. | |
| 2009/0296314 A1 | 12/2009 | Yang | |
| 2013/0122720 A1 | 5/2013 | Takebayashi et al. | |
| 2014/0080283 A1 | 3/2014 | Song et al. | |
| 2014/0327062 A1 | 11/2014 | Park et al. | |

FOREIGN PATENT DOCUMENTS

| | | |
|---|---|---|
| KR | 10-0990615 | 10/2010 |
| KR | 10-1139369 | 4/2012 |
| KR | 10-2014-0131142 | 11/2014 |
| KR | 10-2013-0090808 | 3/2016 |

\* cited by examiner $C(total) = C1(D\_BL) + C2(D\_DP)$ $$1/C(total) = 1/C1(BL1) + 1/C2(DP1) + 1/C3(BL2) + 1/C4(DP2)$$

SEMICONDUCTOR DEVICE AND METHOD OF MANUFACTURING THE SAME

CLAIM OF PRIORITY

This application claims priority under 35 U.S.C. § 119 to Korean Patent Application No. 10-2016-0068846 filed on Jun. 2, 2016 in the Korean Intellectual Property Office, the disclosure of which is hereby incorporated by reference in its entirety.

BACKGROUND

1. Field

Example embodiments of the inventive concepts relate to semiconductor devices, and more specifically, to semiconductor devices including capacitor structures and methods of manufacturing the same.

2. Description of the Related Art

Due to higher integration and smaller sizes of semiconductor devices, the size of a capacitor of a DRAM device may also be reduced. A thickness of a capacitor dielectric layer between an upper electrode and a lower electrode is also reduced depending on the reduced size of the capacitor. However, due to the reduced thickness of the capacitor dielectric layer, a leakage current of the capacitor can be increased and a short circuit between the upper electrode and the lower electrode or a breakdown of the capacitor dielectric layer can occur.

SUMMARY

According to example embodiments of the inventive concepts, a semiconductor device may include a capacitor dielectric layer on the lower electrode, and an upper electrode on the capacitor dielectric layer. The capacitor dielectric layer may include a base layer on the lower electrode and including a first dielectric material, and a dielectric particle layer in at least a portion of the base layer. The dielectric particle layer may at least partially continuously extend along a thickness direction of the capacitor dielectric layer and including a second dielectric material different from the first dielectric material.

According to example embodiments of the inventive concepts, a semiconductor device may include a lower electrode on a substrate, a capacitor dielectric layer on the lower electrode and having a surface roughness of 0.3 nm or less, and an upper electrode on the capacitor dielectric layer. The capacitor dielectric layer may include a base layer on the lower electrode and including a first dielectric material, and a dielectric particle layer in at least a portion of the base layer. The dielectric particle layer may at least partially continuously extend along a thickness direction of the capacitor dielectric layer and including a second dielectric material different from the first dielectric material.

According to example embodiments of the inventive concepts, a method of manufacturing a semiconductor device may include forming a first electrode on a substrate, forming a base layer on the first electrode using a first dielectric material, forming a dielectric particle layer in at least a portion of the base layer using a second dielectric material to at least partially extend along a grain boundary of the base layer in a thickness direction of the base layer, and forming a second electrode on the base layer and the dielectric particle layer.

According to example embodiments of the inventive concepts, a semiconductor device may include a first electrode, a second electrode, and a capacitor dielectric layer. The capacitor dielectric layer may include a base layer extending between the first and second electrodes to define a thickness thereof, and a dielectric particle layer extending within the base layer along the thickness of the base layer. The base layer may include a dielectric material that is different from that of the dielectric particle layer. The dielectric particle layer may extend along grain boundaries defined between adjacent crystal grains of the base layer. The adjacent crystal grains of the base layer may define a first surface roughness, and the capacitor dielectric layer may have a second surface roughness that is less than the first surface roughness.

BRIEF DESCRIPTION OF THE DRAWINGS

Example embodiments will be more clearly understood from the following detailed description taken in conjunction with the accompanying drawings.

DETAILED DESCRIPTION OF EMBODIMENTS

Various example embodiments will now be described more fully with reference to the accompanying drawings in which some example embodiments are shown. However, the inventive concepts may be embodied in many alternate forms and should not be construed as limited to only example embodiments set forth herein.

Figure 1:
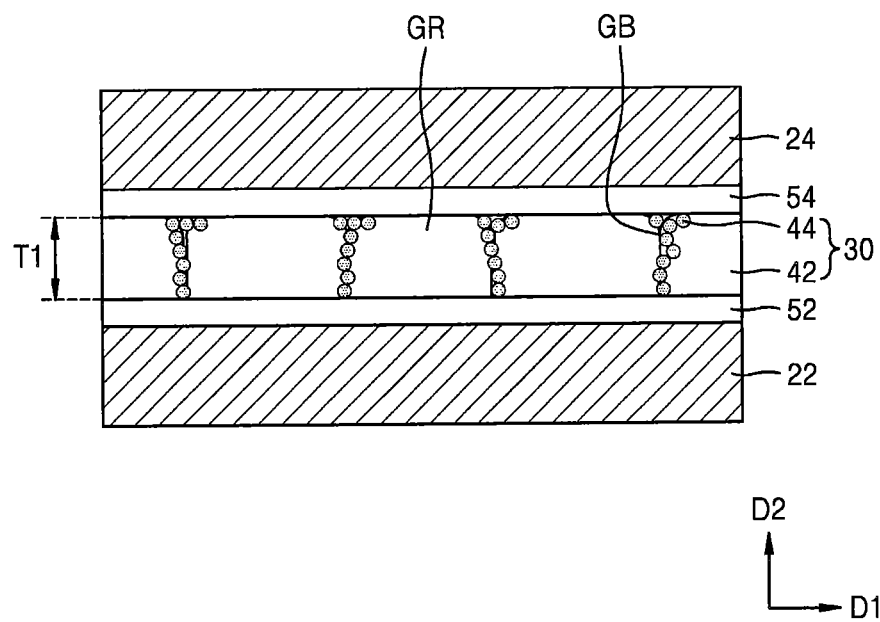
FIG. 1 is a cross-sectional view illustrating a capacitor structure according to example embodiments of the inventive concepts.

FIG. 1 is a cross-sectional view illustrating a capacitor structure 10 according to example embodiments of the inventive concepts.

Referring to FIG. 1, the capacitor structure 10 may include a first electrode 22, a second electrode 24 and a capacitor dielectric layer 30 interposed between the first electrode 22 and the second electrode 24.

In some embodiments, the first electrode 22 may include one or more of doped polysilicon, metal such as ruthenium (Ru), iridium (Ir), titanium (Ti), tantalum (Ta), tungsten (W), conductive metal nitride such as titanium nitride (TiN), tantalum nitride (TaN), tungsten nitride (WN), and conductive metal oxide such as iridium oxide, etc. In other embodiments, the first electrode 22 may be a substrate doped with impurities, for example, a substrate doped with p-type impurities or n-type impurities.

In some embodiments, the second electrode 24 may include one or more of a doped polysilicon, a metal such as ruthenium (Ru), iridium (Ir), titanium (Ti), tantalum (Ta), tungsten (W), a conductive metal nitride such as titanium nitride (TiN), tantalum nitride (TaN), tungsten nitride (WN), and a conductive metal oxide such as iridium oxide, etc.

In some embodiments, the first electrode 22 may correspond to a lower electrode of the capacitor 10, and the second electrode 24 may correspond to an upper electrode of the capacitor 10. In other embodiments, according to a shape of the capacitor 10, the first electrode 22 may correspond to the upper electrode of the capacitor 10, and the second electrode 24 may correspond to the lower electrode of the capacitor 10. In some embodiments, the first electrode 22 may be a channel region of a transistor.

The capacitor dielectric layer 30 may have a first thickness T1 and may be conformally formed on the first electrode 22. Here, a direction parallel to a top surface of the first electrode 22 is referred to as a first direction D1, and a direction vertical or perpendicular to the top surface of the first electrode 22 is referred to as a second direction D2 (e.g. a thickness direction of the capacitor dielectric layer 30). The capacitor dielectric layer 30 may have the first thickness T1 along the second direction D2, and the first thickness T1 may range from about 10 Å to about 200 Å, preferably about 10 Å to about 100 Å, more preferably about 20 Å to about 80 Å, even more preferably about 30 Å to about 60 Å.

The capacitor dielectric layer 30 may include a base layer 42 and a dielectric particle layer 44. The capacitor dielectric layer 30 may include a plurality of the dielectric particle layers 44.

The base layer 42 may be arranged in the first direction D1. The base layer 42 may include a first dielectric material, for example, a high-k dielectric material such as a metal oxide. The first dielectric material may have a higher dielectric constant (e.g., a dielectric constant of 4 to 40) than that of silicon oxide ($SiO_2$). In some embodiments, the first dielectric material may include zirconium oxide ($ZrO_2$), hafnium oxide ($HfO_2$), zirconium silicon oxide ($ZrSiO_x$), hafnium silicon oxide ($HfSiO_x$), zirconium hafnium silicon oxide ($ZrHfSiO_x$), aluminum oxide ($Al_2O_3$), or combinations thereof, but not limited thereto.

As shown in FIG. 1, the base layer 42 may include a plurality of crystal grains GR extending in a thickness direction (e.g., the second direction D2) of the capacitor dielectric layer 30. Grain boundaries GB may be formed between the crystal grains GR. The grain boundary GB may be a boundary or an interface between the adjacent crystal grains GR. The grain boundary GB may be vertically arranged or inclined at a certain angle relative to the top surface of the first electrode 22. For example, the grain boundary GB may mainly extend in the second direction D2 or be inclined at a certain angle (e.g., at an angle of less than 20 degrees) relative to the second direction D2, but not limited thereto. In a process of forming the base layer 42, since the crystal grains GR of the base layer 42 may each be mainly grown along the second direction D2, the grain boundary GB formed at an interface between the adjacent crystal grains GR may extend along substantially the second direction D2 or be inclined relative to the second direction D2.

The dielectric particle layer 44 may be disposed at or extending along at least a portion of the grain boundary GB. The dielectric particle layer 44 may be disposed in at least a portion of the base layer 42. The dielectric particle layer 44 may include a second dielectric material different from the first dielectric material. The second dielectric material may have a higher band gap energy (Eg), such as silicon oxide or metal oxide, and a smaller dielectric constant than the first dielectric material. For example, the second dielectric material may have a dielectric constant of about 3.9 to about 40 and a band gap energy (Eg) of about 4 to about 10 Ev. In some embodiments, the second dielectric material include aluminum oxide ($Al_2O_3$), Beryllium oxide (BeO), boron oxide ($B_2O_3$), silicon oxide ($SiO_2$), scandium oxide ($Sc_2O_3$), yttrium oxide ($Y_2O_3$), lanthanum oxide (La2O3), zirconium hafnium silicon oxide (ZrHfSiOx), aluminum nitride (AlN), boron nitride (BN), silicon nitride ($Si_3N_4$) or combinations thereof, but not limited thereto.

As shown in FIG. 1, the dielectric particle layer 44 may include dielectric nanoparticles dispersed at or along the grain boundary of the base layer 42. Here, the dielectric particle layer 44 may be referred to as a set of the dielectric nanoparticles. That is, the dielectric material particles may contact the grain boundary GB of the base layer 44 and may be collectively disposed adjacent to the grain boundary GB. The dielectric nanoparticles may be disposed on a top surface of the base layer 42. Some of the dielectric nanoparticles of the dielectric particle layer 44 may be in contact with each other and may agglomerate each other. Some of the dielectric nanoparticles may randomly be dispersed. The dielectric particle layer 44 may at least partially continuously extend in at least a portion of the base layer 42. A portion of the dielectric particle layer 44 may extend in the thickness direction (i.e., the second direction D2) of the capacitor dielectric layer 30. The dielectric nanoparticles have a diameter of about 1 Å to 10 Å and may have a spherical shape, a hemispherical shape, an elliptical shape or a dot-shape, but embodiments of the inventive concepts are not limited thereto.

In some embodiments, a mass ratio of the base layer 42 to the dielectric particle layer 44 in the capacitor dielectric layer 30 may be in a range of about 70:30 to about 95:5. For example, the base layer 42 may occupy a considerable amount (e.g., about 70% to about 95%) of a total mass of the capacitor dielectric layer 30. Additionally, a contact area between the first electrode 22 and the base layer 42 or between the second electrode 24 and the base layer 42 may be in a range of about 70% to about 95% of a contact area between the first electrode 22 and the capacitor dielectric layer 30 or between the second electrode 24 and the capacitor dielectric layer 30, but embodiments of the inventive concepts are not limited thereto.

Some of the plurality crystal grains GR of the base layer 42 may contact the dielectric particle layer 44 to form an interface, and the interface between the some of the plurality of crystal grains GR and the dielectric particle layer 44 may extend in the second direction D2 (e.g., the thickness direction of the capacitor dielectric layer 30) from the top surface of the base layer 42 to a bottom surface thereof. Accordingly, the dielectric particle layer 44 may be interposed between the adjacent crystal grains GR of the base layer 42 and may be disposed between a first and second electrodes 22 and 24, thereby forming a sub-capacitor domain D_DP (refer to 20A). As a result, a sub-capacitor domain D_BL (refer to 20A) formed by the plurality of crystal grains GR of the base layer 42 and the sub-capacitor domain D_DP formed by the dielectric particle layer 44 may be connected in parallel, and thus the capacitor structure 10 may have a high capacitance. This will be described in detail later with reference to FIGS. 20A and 20B.

In some embodiments, the capacitor dielectric layer 30 may have a flat or substantially planar top surface profile and a low surface roughness. The capacitor dielectric layer 30 may have a surface roughness of about 0.3 nm or less, preferably about 0.2 nm or less. The base layer 42 may have the plurality of crystal grains GR that extend in the second direction D2, and the dielectric particle layer 44 may be disposed in a space between the crystal grains GR at the grain boundary GB and may include the dielectric nanoparticles having the spherical shape or the elliptical shape such that the capacitor dielectric layer 30 may have a flat or substantially planar top surface profile.

In general, in embodiments in which the top surface profile of the capacitor dielectric layer 30 is not flat or the surface roughness thereof is high, a void may be formed between the first electrode 22 and the capacitor dielectric layer 30 or between the second electrode 24 and the capacitor dielectric layer 30. Due to a thermal or electrical stress generated during the process of forming the capacitor structure 10 or the following process, the void may be enlarged or defects in the capacitor dielectric layer 30 may be concentrated into the void. Thus, the void may be a leakage current path in the capacitor structure 10, and/or a breakdown of the capacitor dielectric layer 30 or a short circuit between the first electrode 22 and the second electrode 24 may generated through the void.

However, although the base layer 42 includes a relatively high surface roughness, since the dielectric particle layer 44 is disposed between the crystal grains GR of the base layer 42, the entire top surface profile of the capacitor dielectric layer 30 may be improved. Accordingly, the leakage current of the capacitor structure 10 may be reduced and the breakdown or the short circuit of the capacitor structure 10 may be reduced or prevented from occurring.

A first interface layer 52 may be selectively disposed between the first electrode 22 and the capacitor dielectric layer 30, and a second interface layer 54 may be disposed between the second electrode 24 and the capacitor dielectric layer 30. For example, the first and second interface layers 52 and 54 may act as a barrier layer to reduce or prevent impurities from diffusing and/or moving between the first electrode 22 and the capacitor dielectric layer 30 or between the second electrode 24 and the capacitor dielectric layer 30. For example, the first and second interface layers may reduce or prevent some of nitrogen atoms contained in the first and second electrodes 22 and 24 from penetrating into the capacitor dielectric layer 30 and/or may reduce or prevent oxygen atoms contained in the capacitor dielectric layer 30 10 from diffusing into the first and second electrodes 22 and 24 while manufacturing the capacitor structure 10.

In some embodiments, the first and second interface layers 52 and 54 may include an electrically conductive transition metal oxide, such as titanium oxide ($TiO_x$, $0<x<2$), titanium aluminum oxide ($TiAlO_x$), manganese oxide ($MnO_x$, $0<x<2$), or TiON, but not limited thereto. The first and second interface layers 52 and 54 may be thinly formed not to act as a capacitor dielectric layer of the capacitor structure. For example, the first and second interface layers 52 and 54 may have a thickness of about 1 Å to 10 Å in the second direction D2, but not limited thereto.

In some embodiments, the first and second interface layers 52 and 54 may be omitted, and thus the capacitor dielectric layer 30 may be formed to directly contact the first and second electrodes 22 and 24.

In some embodiments, the first interface layer 52 may be omitted and the second interface layer 54 may be formed between the second electrode 24 and the capacitor dielectric layer 30.

In some embodiments, the second interface layer 54 may be omitted and the first interface layer 52 may be formed between the first electrode 22 and the capacitor dielectric layer 30.

Hereinafter, with reference to FIGS. 20A and 20B along with FIG. 1, a capacitance model of the capacitor dielectric layer 30 is described.

Figure 20A:
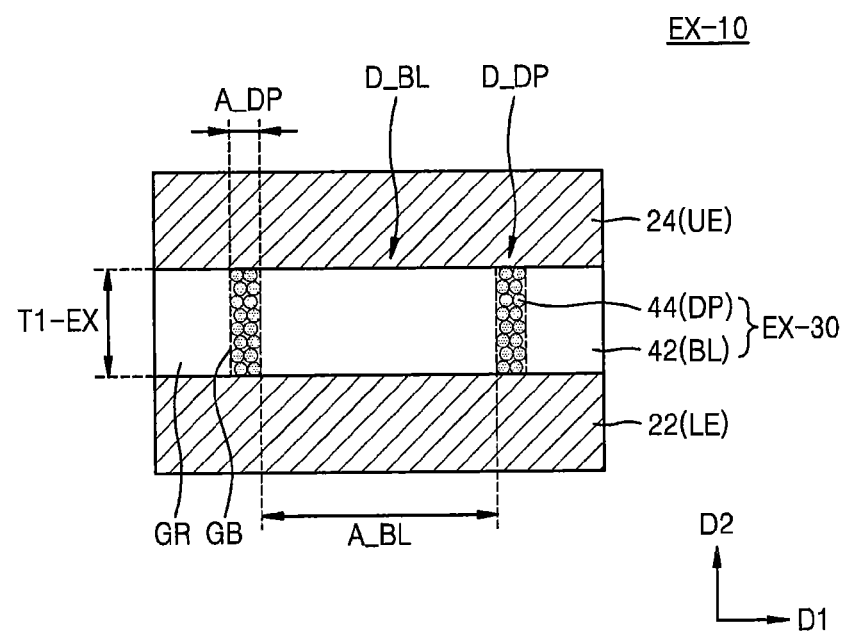
FIG. 20A is a schematic view and an equivalent circuit diagram illustrating a capacitor structure according to example embodiments of the inventive concepts.
Figure 20A:
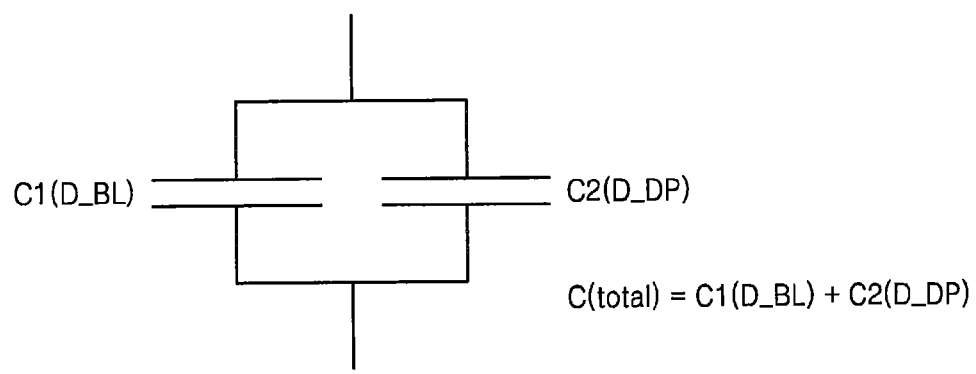

FIG. 20A shows a schematic cross-sectional view of a capacitor structure EX-10 and an equivalent circuit diagram thereof according to example embodiments of the inventive concepts as described with reference to FIG. 1.

For example, as shown in FIG. 20A, the dielectric particle layer 44 (DP) may have a predetermined width and may extend in the second direction D2 (e.g., a vertical direction to a top surface of a lower electrode LE). In this case, a portion of the dielectric particle layer 44 (DP) disposed between the lower electrode LE and an upper electrode UE may act as a capacitor dielectric layer of the capacitor structure EX-10. Accordingly, the capacitor structure EX-10 may represent a capacitance of the dielectric particle layer 44 (DP), as well as a capacitance of the base layer 42 (BL).

Specifically, the crystal grains GR of the base layer 42 (BL) may form the first sub-domain D_BL between the upper and lower electrodes UE and LE, and the dielectric particle layer 44 (DP) may form the second sub-domain D_DP between the upper and lower electrodes UE and LE. Further, a contact area A_DP of the dielectric particle layer 44 (DP) contacting the lower electrode LE or upper electrode UE and a contact area A_BL of the base layer 42 (BL) contacting the lower electrode LE or upper electrode UE may be respectively obtained.

As shown in the equivalent circuit diagram at a bottom of FIG. 20A, the first sub-domain D_BL and the second sub-domain D_DP may be connected in parallel with each other, and thus a total capacitance C(total) of the capacitor structure EX-10 may be equal to a sum of a first capacitance C1(D_BL) obtained from the first sub-domain D_BL and a second capacitance C2(D_DP) obtained from the second sub-domain D_DP (i.e., it can be expressed by the following equation: C(total)=C1(D_BL)+C2 (D_DP).

Figure 20B:
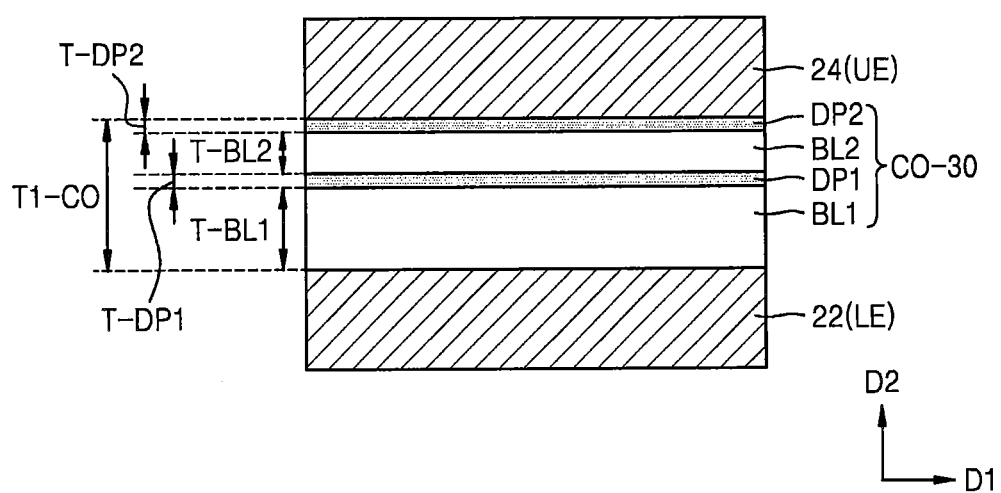
FIG. 20B is a schematic view and an equivalent circuit diagram illustrating a capacitor structure according to a comparative example.
Figure 20B:
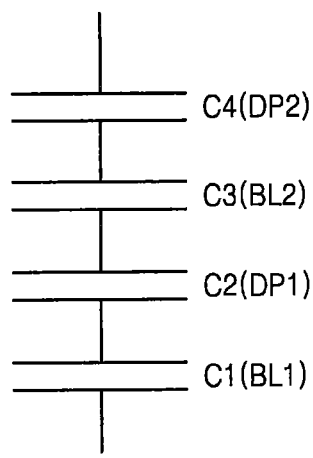

FIG. 20B shows a schematic cross-sectional view of a capacitor structure CO-10 and an equivalent circuit diagram thereof according to a comparative example.

Referring to FIG. 20B, the capacitor structure CO-10 according to the comparative example may include a capacitor dielectric layer CO-30 between a lower electrode LE and an upper electrode UE, and the capacitor dielectric layer CO-30 may include a first base layer BL1, a first dielectric layer DP1, a second base layer BL2 and a second dielectric layer DP2 that are sequentially stacked on the lower electrode LE. Here, each layer of the capacitor dielectric layer CO-30 may be conformally arranged with a predetermined thickness and may extend in the first direction D1.

As shown in the equivalent circuit diagram at the bottom of FIG. 20B, in the capacitor structure CO-10 according to the comparative example, the first base layer BL1, the first dielectric layer DP1, the second base layer BL2 and the second dielectric layer DP2 may be respectively correspond to a first capacitor, a second capacitor, a third capacitor and a fourth capacitor that are connected in series with each other. Accordingly, a total capacitance of the capacitor structure CO-10 may be determined from the following Equation 1:

$$1/C(\text{total})=1/C1(BL1)+1/C2(DP1)+1/C3(BL2)+1/C4(DP2)\qquad \text{Equation 1}$$

According to the equation 1, the total capacitance C(total) of the capacitor structure according to the comparative example may be determined based on a dielectric constant and a thickness of each layer of the capacitor dielectric layer CO-30. Meanwhile, a total thickness T1-CO of the capacitor dielectric layer CO-30 may be smaller as the semiconductor device is scaled down, and thus, the thickness of each layer of the capacitor dielectric layer CO-30 may also be reduced.

In general, when the first and second base layers BL1 and BL2 are thin, crystallinity of the first and second base layers BL1 and BL2 may be reduced, and/or the first and second base layers BL1 and BL2 may have an amorphous structure. In this case, a dielectric constant of the first and second base layers BL1 and BL2 may be decreased. For example, when the second base layer BL2 is formed to a thickness T-BL2 of less than a predetermined critical thickness in order to reduce the total thickness T1-CO of the capacitor dielectric layer CO-30, the second base layer BL2 having the amorphous structure may be formed. For example, in embodiments in which the first and second base layers BL1 and BL2 include zirconium oxide ($ZrO_2$), a dielectric constant of an amorphous zirconium oxide may be about 30% smaller than a dielectric constant of a crystal zirconium oxide. Accordingly, the capacitance C(total) of the capacitor structure CO-30 may be further reduced depending on a reduction of the total thickness T1-CO of the capacitor structure CO-30.

However, the capacitor structure EX-10 according to the example embodiment of the inventive concepts, since the base layer 42(BL) is formed to a thickness equal to the entirety of the total thickness T1-EX of the capacitor dielectric layer EX-30, crystallinity of the base layer 42(BL) may not be reduced and the base layer 42(BL) may not also have an amorphous structure. Accordingly, when the capacitor dielectric layer EX-30 has a thickness greater than the predetermined critical thickness although the thickness T1-EX of the capacitor dielectric layer EX-30 is decreased, the base layer 42 (BL) may be formed in a crystal structure, and thus the base layer 42(BL) may have a high dielectric constant in comparison with the base layer 42(BL) of the amorphous structure. In other words, although the capacitor structure EX-10 is thin, the capacitor structure EX-10 may have a high capacitance. In embodiments in which the capacitor structure EX-10 includes the capacitor dielectric layer EX-30 that has a thin thickness T1-EX of less than 100 Å and of which the base layer 42(BL) is formed using zirconium oxide and the dielectric particle layer 44 (DP) is formed using aluminum oxide, the capacitance of the capacitor dielectric layer EX-30 may be about 20% higher than that of the capacitor dielectric layer CO-30 according to the comparative example having the same thickness T1-CO as the capacitor dielectric layer EX-30. This result can be confirmed through the experimental result of FIG. 21.

Figure 21:
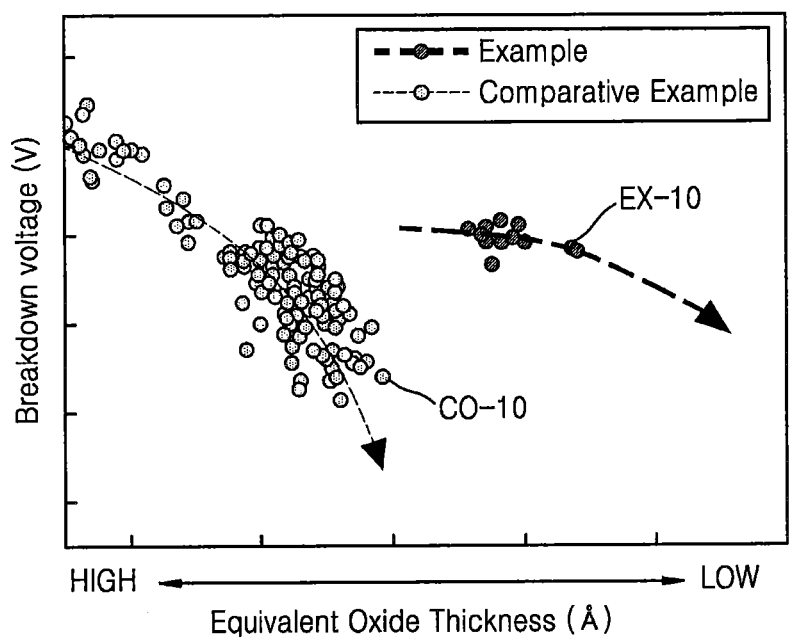
FIG. 21 is a graph illustrating a relationship between a breakdown voltage and an equivalent oxide thickness of a capacitor structure according to example embodiments of the inventive concepts.

FIG. 21 is a graph illustrating a relationship between a breakdown voltage (V) and an equivalent oxide thickness (Å) of the capacitor structure EX-10 according to the example embodiment. In addition, in FIG. 21, a relationship between a breakdown voltage (V) and an equivalent oxide thickness (Å) of the capacitor structure CO-10 according to the comparative example are illustrated.

Referring to FIG. 21, it can be confirmed that the capacitor structure EX-10 according to the example embodiment has a lower equivalent oxide thickness and a higher breakdown characteristic, as compared to the capacitor structure CP-10 according to the comparative example.

Referring again to FIG. 1, although the capacitor structure 10 according to the example embodiment includes the capacitor dielectric layer 30 having a thin first thickness T1, the capacitor structure 10 may have a high capacitance, and the leakage current or the short circuit between the first and second electrodes 22 and 24 through the capacitor dielectric layer 30 may be reduced or prevented from occurring.

Figure 2:
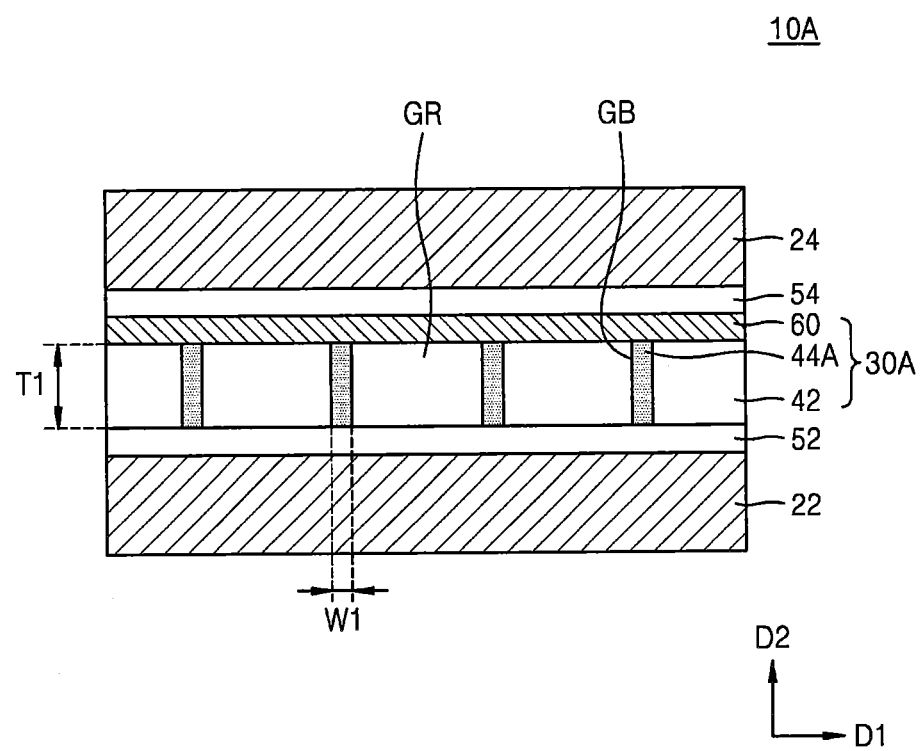
FIG. 2 is a cross-sectional view illustrating a capacitor structure according to example embodiments of the inventive concepts.

FIG. 2 is a cross-sectional view illustrating a capacitor structure 10A according to example embodiments of the inventive concepts. In FIG. 2, the same reference numerals denote the same elements as in FIG. 1.

Referring to FIG. 2, the capacitor structure 10A may include a capacitor dielectric layer 30A including a base layer 42 and a dielectric particle layer 44A. The dielectric particle layer 44A may have a first width W1 in the first direction D1 and may have a pillar shaped cross-section continuously extending in the second direction D2 over the entire thickness of the capacitor dielectric layer 30A from a top surface of the capacitor dielectric layer 30A to a bottom surface thereof.

In the capacitor structure 10A, the dielectric particle layer 44A may be disposed to continuously fill a space between crystal grains GR of the base layer 42. For example, when the dielectric particle layer 44A includes a material having an improved gap-filling property, the dielectric particle layer 44A may be formed to have a pillar shaped cross-section continuously extending over the entire thickness of the capacitor dielectric layer 30A.

The dielectric particle layer 44A may have the first width W1 that is substantially uniform, but embodiments of the inventive concepts are not limited thereto. The dielectric particle layer 44A may vertically extend relative to a top surface of a first electrode 22 as show in FIG. 2, but embodiments of the inventive concepts are not limited thereto. In some embodiments, the dielectric particle layer 44A, and the crystal grain GR or a grain boundary GB of the base layer 30A may extend while inclined at a certain angle relative to the top surface of a first electrode 22.

A dielectric capping layer 60 may be disposed on the base layer 42 and the dielectric particle layer 44A. The dielectric capping layer 60 may include a third dielectric material. The third dielectric material may be a dielectric material having a high band gap energy (Eg), such as silicon oxide, metal oxide, and a lower dielectric constant than the second dielectric material. For example, the third dielectric material may have a band gap energy (Eg) of about 5 to about 10 Ev and a dielectric constant of about 3.9 to about 40. In some embodiments, the third dielectric material may include aluminum oxide ($Al_2O_3$), beryllium oxide (BeO), boron oxide ($B_2O_3$), silicon oxide ($SiO_2$), scandium oxide ($Sc_2O_3$), yttrium oxide ($Y_2O_3$), lanthanum oxide ($La_2O_3$), zirconium hafnium silicon oxide (ZrHfSiOx), aluminum nitride (AlN), boron nitride (BN), silicon nitride ($Si_3N_4$) or combinations thereof, but not limited thereto.

In some embodiments, the dielectric capping layer 60 may include the same material as the dielectric particle layer 44A. For example, when the dielectric particle layer 44A includes aluminum oxide ($Al_2O_3$), the dielectric capping layer 60 may include aluminum oxide ($Al_2O_3$). For example, when the dielectric particle layer 44A includes boron oxide ($B_2O_3$), the dielectric capping layer 60 may include boron oxide ($B_2O_3$). In other embodiments, the dielectric capping layer 60 may include a different material from the dielectric particle layer 44A. For example, when the dielectric particle layer 44A includes aluminum oxide ($Al_2O_3$), the dielectric capping layer 60 may include aluminum nitride (AlN). For example, when the dielectric particle layer 44A includes boron oxide ($B_2O_3$), the dielectric capping layer 60 may include boron nitride (BN), but not limited thereto.

The dielectric capping layer 60 may act as a protection layer to reduce or prevent moisture or humidity from penetrating into the capacitor dielectric layer 30A through the dielectric particle layer 44A or through an interface between the dielectric particle layer 44A and the base layer 42. Additionally, the dielectric capping layer 60 may act as a leveling layer to reduce a surface roughness of the capacitor dielectric layer 30A.

Figure 3:
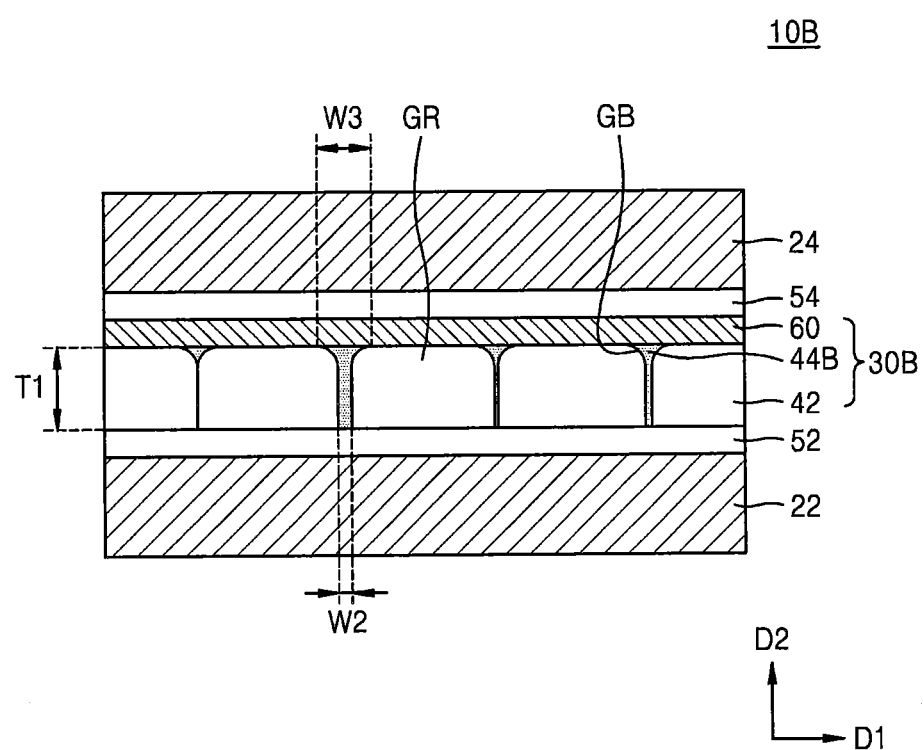
FIG. 3 is a cross-sectional view illustrating a capacitor structure according to example embodiments of the inventive concepts.

FIG. 3 is a cross-sectional view illustrating a capacitor structure 10B according to example embodiments of the inventive concepts. In FIG. 3, the same reference numerals denote the same elements as in FIGS. 1 and 2.

Referring to FIG. 3, a dielectric particle layer 44B may continuously extend in the second direction D2 over an entire thickness of a capacitor dielectric layer 30B from a top surface of the capacitor dielectric layer 30B to a bottom surface thereof. In the dielectric particle layer 44B, a width W2 of one end thereof facing a first electrode 22 may be smaller than a width W3 of another end thereof facing a second electrode 24. Thus, the lower width W2 of the dielectric particle layer 44B may be smaller than the upper width W3 thereof along the second direction D2 from a top surface of the first electrode 22. When crystal grains GR of a base layer 42 have a high surface roughness, a relatively large space between the crystal grains GR may be formed at a top of the base layer 42 as compared to at a bottom of the base layer 42. The dielectric particle layer 44B may be formed to fill the space between the crystal grains GR, and thus may have a pillar shaped cross-section that has the upper width W3 greater than the lower width W2, but embodiments of the inventive concepts are not limited thereto. In some embodiments, the relatively large space between the crystal grains GR of the base layer 42 may be formed at the bottom of the base layer 42 as compared to at the top of the base layer 42, and the dielectric particle layer 44B may be formed to fill the space between the crystal grains GR such that the lower width of the dielectric particle layer 44B is greater than the upper width thereof.

Figure 4:
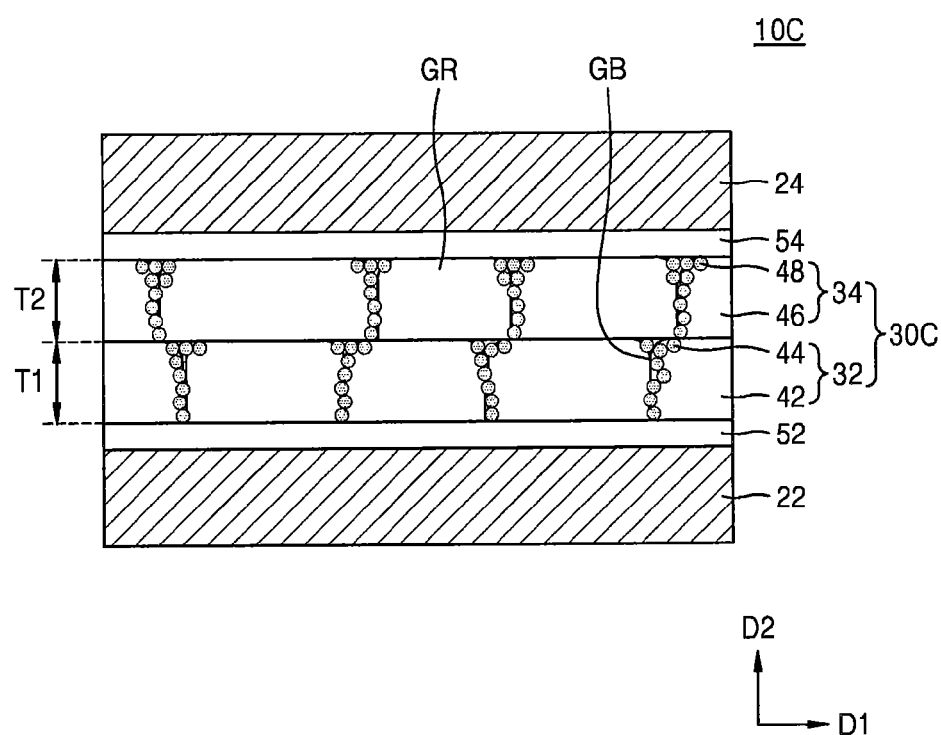
FIG. 4 is a cross-sectional view illustrating a capacitor structure according to example embodiments of the inventive concepts.

FIG. 4 is a cross-sectional view illustrating a capacitor structure 10C according to example embodiments of the inventive concepts. In FIG. 4, the same reference numerals denote the same elements as in FIGS. 1 to 3.

Referring to FIG. 4, the capacitor structure 10C may include a capacitor dielectric layer 30C including a first dielectric layer 32 and a second dielectric layer 34 that are sequentially stacked on a first electrode 22. The first dielectric layer 32 may include a first base layer 42 and a first dielectric particle layer 44 disposed between crystal grains GR of the first base layer 42, and the second dielectric layer 34 may include a second base layer 46 and a second dielectric particle layer 48 disposed between crystal grains GR of the second base layer 46. The first and second base layers 42 and 46 and the first and second dielectric particle layers 44 and 48 may respectively have the same features as the base layer 42 and the dielectric particle layer 44 as described with reference to FIG. 1.

The first dielectric layer 32 may have a first thickness T1 along a second direction D2 (e.g. a thickness direction of a capacitor dielectric layer 30C). The second dielectric layer 34 may have a second thickness T2 along the second direction D2. The first thickness T1 may be equal to or different from the second thickness T2.

In some embodiments, in the capacitor dielectric layer 30C, the first dielectric layer 32 including the first base layer 42 and the first dielectric layer 44 may have a structure including three or more layers stacked in the second direction.

In an example method for forming the capacitor dielectric layer 30C, after forming the first base layer 42 on the first electrode 22, the first dielectric particle layer 44 may be formed at a grain boundary GB of the first base layer 42, and the second base layer 46 may be formed on the first base layer 42 and the first dielectric particle layer 44. In this case, the first dielectric layer 32 may have a flat or substantially planar top surface profile and a low surface roughness. Thus, when forming the second base layer 46 on the first dielectric layer 32 having the flat or substantially planar top surface profile, the second base layer 46 may be formed to have an improved crystallinity.

Figure 5:
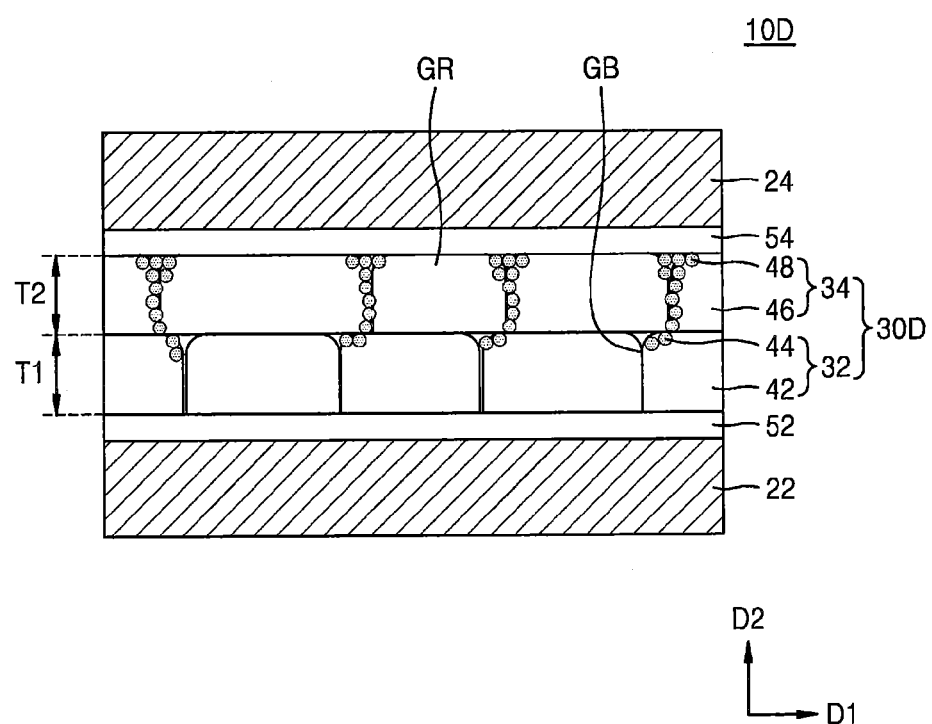
FIG. 5 is a cross-sectional view illustrating a capacitor structure according to example embodiments of the inventive concepts.

FIG. 5 is a cross-sectional view illustrating a capacitor structure 10D according to example embodiments of the inventive concepts. In FIG. 5, the same reference numerals denote the same elements as in FIGS. 1 to 4.

Referring to FIG. 5, the capacitor structure 10D may include a capacitor insulating layer 30D including a first dielectric layer 32 and a second dielectric layer 34 that are sequentially stacked on a first electrode 22. The first dielectric layer 32 may include a first base layer 42 and a first dielectric particle layer 44 disposed at only a grain boundary of an upper portion of the first base layer 42. In other words, the first dielectric particle layer 44 may be formed with a predetermined height toward a bottom surface of the first dielectric layer 32 from a top surface of the first dielectric layer 32 and may not be formed at the grain boundary of a lower portion of the base layer 42. That is, the lower portion of the base layer 42 may be free of the first dielectric particle layer 44.

In a process for forming the capacitor dielectric layer 30D, after forming the first base layer 42 on the first electrode 22, a second base layer 46 may be formed on the first base layer 42. Next, a second dielectric particle layer 48 including dielectric nanoparticles may be formed at a grain boundary GB of the second base layer 46. The dielectric nanoparticles may diffuse or move along a space between crystal grains GR of the second base layer 46, and thus some of the dielectric nanoparticles may be disposed at the grain boundary of the upper portion of the first base layer 42 to form the first dielectric particle layer 44.

Figure 6A:
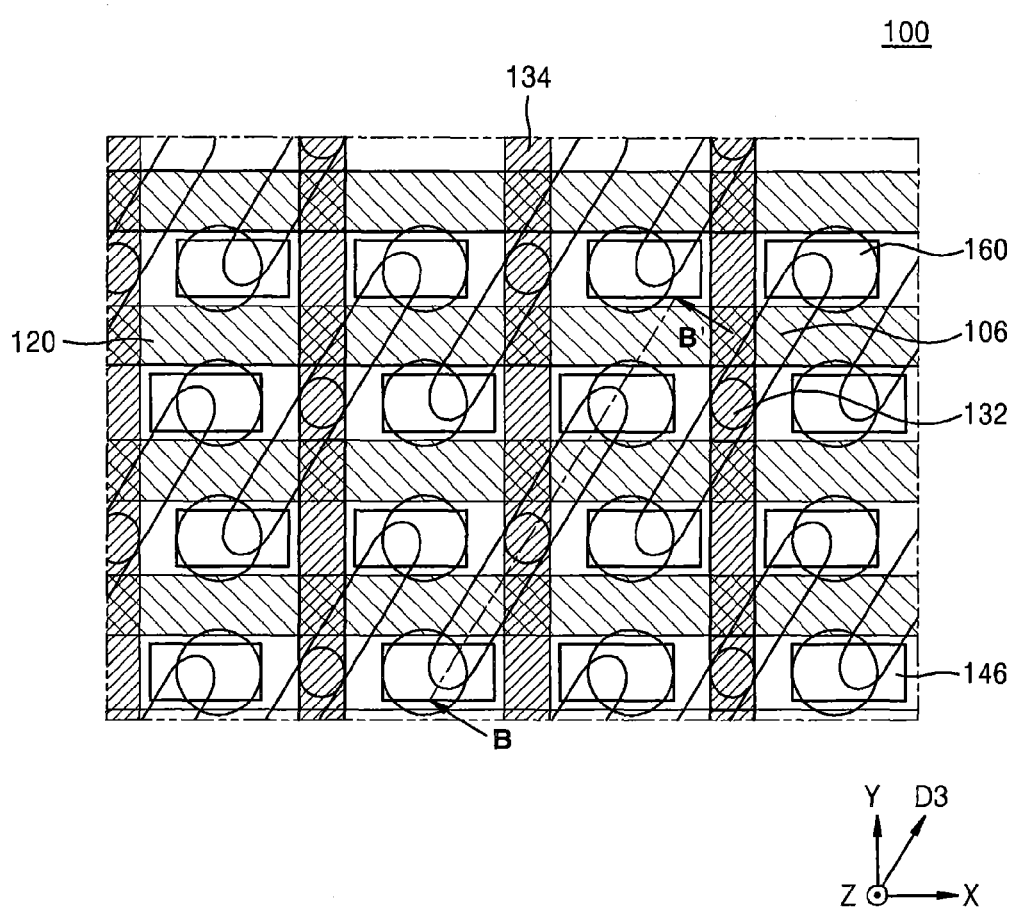
FIG. 6A is a schematic lay-out diagram illustrating a semiconductor device according to example embodiments of the inventive concepts.
Figure 6B:
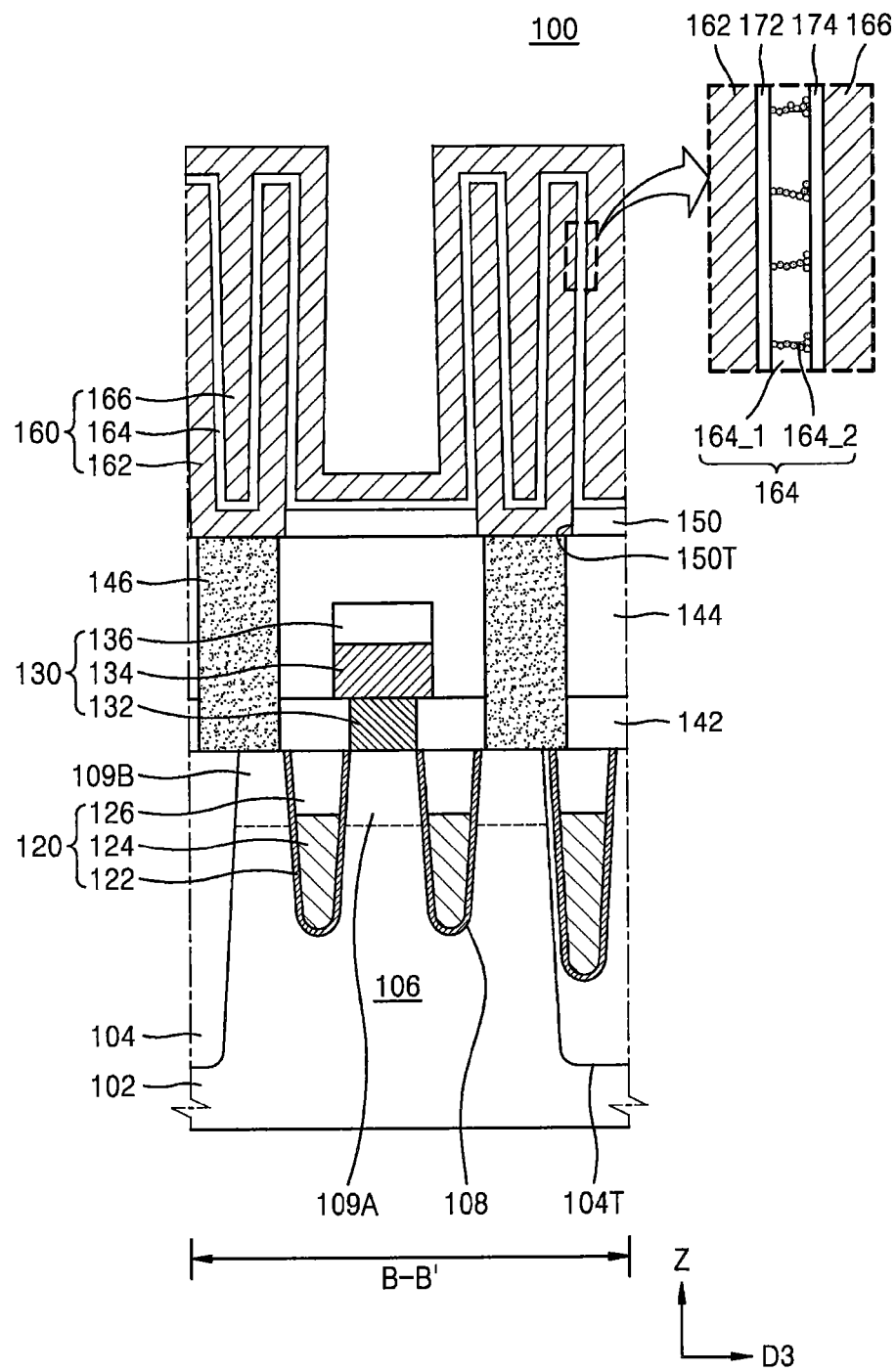
FIG. 6B is a cross-sectional view taken along line B-B' of FIG. 6A.

FIG. 6A is a schematic lay-out diagram illustrating a semiconductor device 100 according to example embodiments of the inventive concepts. FIG. 6B is a cross-sectional view taken along line B-B' of FIG. 6A. In FIGS. 6A and 6B, the same reference numerals denote the same elements as in FIGS. 1 to 5.

Referring to FIGS. 6A and 6B, the substrate 102 may include an active region 106 defined by an isolation layer 104. A plurality of active regions 106 may be formed in the substrate 102.

The substrate 102 may include silicon (Si), e.g., crystalline silicon, polycrystalline silicon, or amorphous silicon. In some embodiments, the substrate 102 may include a semiconductor material, such as germanium (Ge), silicon germanium (SiGe), silicon carbide (SiC), gallium arsenide (GaAs), indium arsenide (InAs), or indium phosphide (InP). The substrate 102 may include a conductive region, e.g., a well doped with impurities or a structure doped with impurities.

The isolation layer 104 may have a shallow trench isolation (STI) structure. The isolation layer 104 may include an insulating material filling an isolation trench 104T formed in the substrate 102. The insulating material may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), tonen silazene (TOSZ) or combinations thereof, but not limited thereto.

The active region 106 may have a long island shape that has a short axis and a long axis. The long axis of the active region 106 may be parallel to a D3 direction parallel to a top surface of the substrate 102. In some embodiments, the active region 106 may have a first conductivity type. The first conductivity type may be p-type or n-type.

The substrate 102 may include a trench 108 extending along an X direction parallel to the top surface of the substrate and crossing the D3 direction at a certain angle. The trench 108 may traverse the active region 106 and may be formed to a predetermined depth. A portion of the trench 108 may extend into the isolation layer 104. The portion of the trench 108 in the isolation layer 104 may have a bottom surface positioned at a lower level than other portion of the trench 108 in the active region 106.

A first source/drain region 109A and a second source/drain region 109B may be disposed in an upper portion of the active region 106 at opposite sides of the trench 108. The first and second source/drain regions 109A and 109B may be impurity regions doped with impurities of a second conductivity type different from the first conductivity type. The second conductivity type may be n-type or p-type.

A gate structure 120 may be formed in the trench 108. The gate structure 120 may include a gate insulating layer 122, a gate electrode 124 and a gate capping layer 126 that are sequentially formed on an inner surface of the trench 108.

The gate insulating layer 122 may be conformally formed to a predetermined thickness on the inner surface of the trench 108. The gate insulating layer 122 may include one or more of silicon oxide, silicon oxynitride, silicon nitride and a high-k dielectric material having a higher dielectric constant than silicon oxide. The high-k dielectric material may include metal oxide or metal oxynitride, such as hafnium oxide, hafnium oxynitride, hafnium silicon oxide, but not limited thereto. In some embodiments, when the gate insulating layer 122 includes silicon oxide, the gate insulating layer 122 may be formed on an exposed surface of the substrate 102 by a thermal oxidation process. In other embodiments, the gate insulating layer 122 may be formed by a low pressure chemical vapor deposition (LPCVD) process, a plasma enhance CVD (PECVD) process, an ultra-high vacuum CVD (UHV-CVD) process, or an atomic layer deposition (ALD) process.

The gate electrode 124 may be formed on the gate insulating layer 122 to fill the trench 108 to a predetermined height from the bottom surface of trench 108. The gate electrode 124 may include a work function adjustment layer on the gate insulating layer 122 and a buried metal layer, on the work function adjustment layer, filling a lower portion of the trench 108. The work function adjustment layer include metal, metal oxide or metal carbide, such as TiN, TiAlN, TiAlC, TiAlCN, TiSiCN, Ta, TaN, TaAlN, TaAlCN, TaSiCN, etc. The buried metal layer may include one or more of W, WN, TiN and TaN.

The gate capping layer 126 may be formed on the gate electrode layer 124 to fill a remaining portion of the trench 108. The gate capping layer 126 may include one or more of silicon oxide, silicon nitride and silicon oxynitride.

The gate electrode 124 may have a top surface positioned at a higher level than bottom surfaces of the first and second source/drain regions 109A and 109B. In some embodiments, the bottom surface of one of the first and second source/drain regions 109A and 109B may be positioned at a lower level than the bottom surface of the other of the first and second source/drain regions 109A and 109B such that the first and second source/drain regions 109A and 109B have different heights. In this case, for example, the top surface of the gate electrode 124 may be positioned at a lower level than the bottom surface of the first source/drain region 109A and at a higher level than the bottom surface of the second source/drain region 109B. In some embodiments, the gate electrode 124 may have a top surface positioned at a lower level than bottom surfaces of the first and second source/drain regions 109A and 109B.

A bit line structure 130 may be formed on the first source/drain region 109A to extend along a Y direction parallel to the top surface of the substrate 102 and vertical or perpendicular to the X direction. The bit line structure 130 may include a bit line contact 132, a bit line 134 and a bit line capping layer 136 that are sequentially stacked on the substrate 102. For example, the bit line contact 132 may include polysilicon, and the bit line 134 may include metal. The bit line capping layer 136 may include an insulating material such as silicon nitride or silicon oxynitride.

A bit line intermediate layer may further be interposed between the bit line contact 132 and the bite line 134. The bit line intermediate layer may include metal silicide such as tungsten silicide or metal nitride such as tungsten nitride. A bit line spacer may further be formed on sidewalls of the bit line structure 130. The bit line spacer may include a single- or multi-layer structure formed of an insulating material such as silicon oxide, silicon oxynitride or silicon nitride. The bit line spacer may further include an air space.

A first insulating interlayer 142 may be formed on the substrate 102. The bit line contact 132 may penetrate the first insulating interlayer 142 to be connected to the first source/drain region 109A. The bit line 134 and the bit line capping layer 136 may be disposed on the first insulating interlayer 142. A second insulating interlayer 144 may be disposed on the first insulating interlayer 142 to extend on or cover the bit line 134 and the bit line capping layer 136.

A contact structure 146 may be formed on the second source/drain region 109B. The first and second insulating interlayer 142 and 144 may extend on or cover sidewalls of the contact structure 146. In some embodiments, the contact structure 146 may include a lower contact pattern, a metal silicide layer and upper contact pattern that are sequentially stacked on the substrate 102 and a barrier layer surrounding sidewalls and a bottom surface of the upper contact pattern. In some embodiments, the lower contact pattern may include polysilicon, and the upper contact pattern may include metal. The barrier layer may include metal nitride.

A capacitor structure 160 may be formed on the second insulating interlayer 144. The capacitor structure 160 may include a lower electrode 162 electrically connected to the contact structure 146, a capacitor dielectric layer 164 on the lower electrode 162 and an upper electrode 166 on the capacitor dielectric layer 164. An etch stop layer 150 including an opening 150T may be formed on the second insulating interlayer 144. A lower portion of the lower electrode 162 may be disposed in the opening 150T of the etch stop layer 150.

The lower electrode 162 may be formed on the contact structure 146 in a cylindrical shape having a closed bottom or a cup shape, and the capacitor dielectric layer 164 may be conformally formed on the lower electrode 162. The capacitor dielectric layer 164 may include a base layer 164_1 and a dielectric particle layer 164_2 disposed between the crystal grains of the base layer 164_1. The base layer 164_1 and the dielectric particle layer 164_2 may have the same features as the base layer 42 and the dielectric particle layer 44 of FIG. 1. Accordingly, further details of the base layer 164_1 and the dielectric particle layer 164_2 may refer to the detailed descriptions of the base layer 44 and the dielectric particle layer 44 made with reference to FIG. 1. Meanwhile, the capacitor dielectric layer 164 may have features similar to or the same as the capacitor dielectric layers 30A, 30B, 30C and/or 30D as described with reference to FIGS. 2 to 5.

A first interface layer 172 and the second interface layer 174 may be formed between the capacitor dielectric layer 164 and the lower electrode 162 and between the capacitor dielectric layer 164 and the upper electrode 166, respectively. The first and second interface layers 172 and 174 may have the same or similar features as the first and second interface layers 52 and 54 as described with reference to FIG. 1.

In some embodiments, in the semiconductor device 100 according to the example embodiment, although a thickness of the capacitor dielectric layer 164 is small, the capacitor structure may have a high capacitance and a leakage current or a short circuit between the lower and second electrodes 162 and 164 through the capacitor dielectric layer 164 may be reduced or prevented from occurring.

Figure 7:
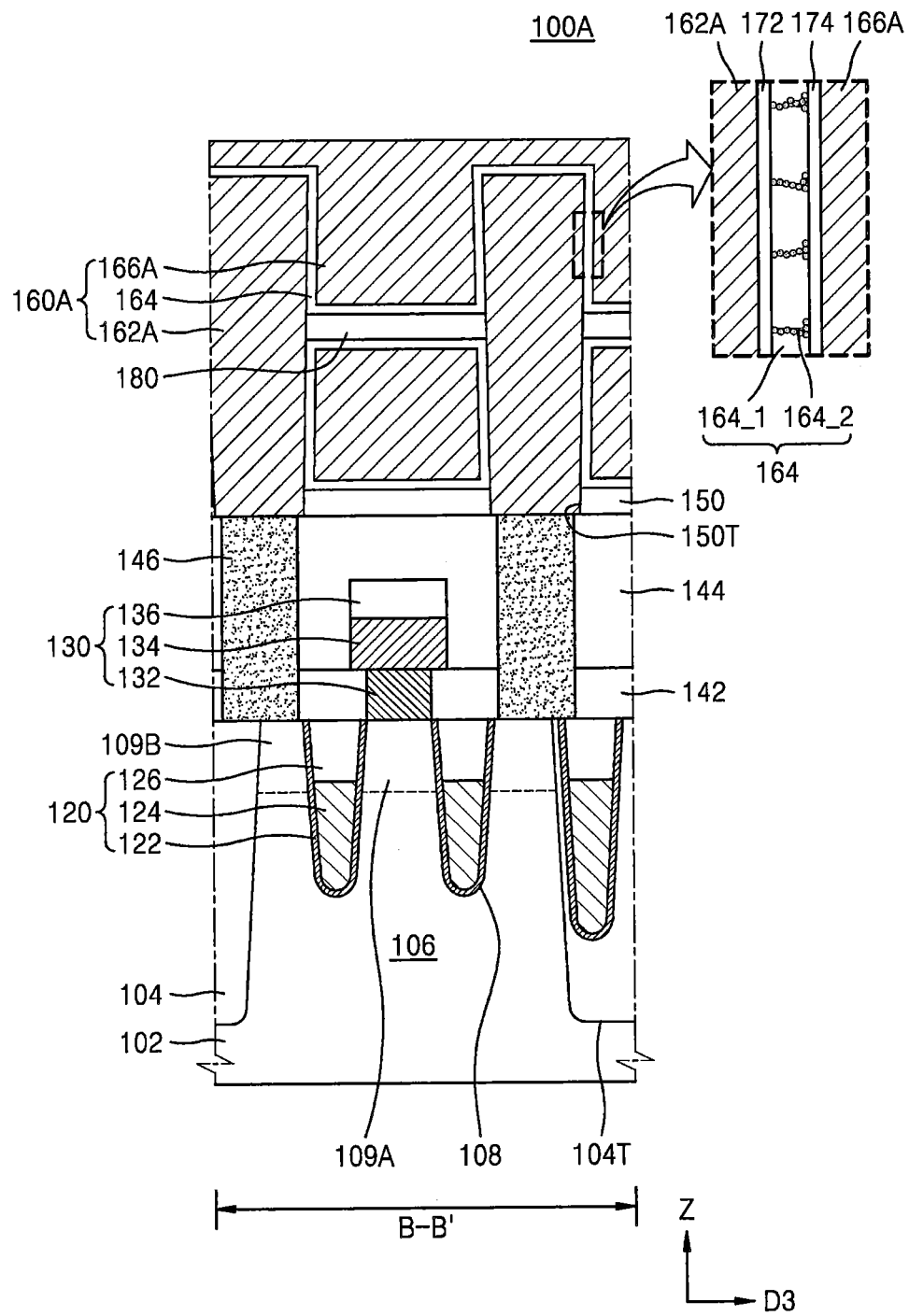
FIG. 7 is a cross-sectional view illustrating a semiconductor device according to example embodiments of the inventive concepts.

FIG. 7 is a cross-sectional view illustrating a semiconductor device 100A according to example embodiments of the inventive concepts. FIG. 7 is the cross-sectional view corresponding to a cross-section taken along B-B' of FIG. 6A. In FIG. 7, the same reference numerals denote the same elements as in FIGS. 1 to 6B.

Referring to FIG. 7, a capacitor structure 160A may have a pillar shaped lower electrode layer 162A. A supporting member 180 may be disposed on a portion of a sidewall of the lower electrode 162A to reduce or prevent collapse of the lower electrode 162A. The capacitor dielectric layer 164 may be conformally formed on the lower electrode 162A and the supporting member 180. The capacitor dielectric layer 164 may have features similar to or the same as the capacitor dielectric layer 30, 30A, 30B, 30C and/or 30D as described with reference to FIGS. 1 to 5. An upper electrode 166A may be formed on the capacitor dielectric layer 164 to fill a space between the adjacent lower electrodes 162A.

In some embodiments, in the semiconductor device 100A according to the example embodiment, although a thickness of the capacitor dielectric layer 164 is small, the capacitor structure may have a high capacitance and a leakage current or a short circuit between the lower and second electrodes 162A and 166A through the capacitor dielectric layer 164 may be reduced or prevented from occurring.

Figure 8:
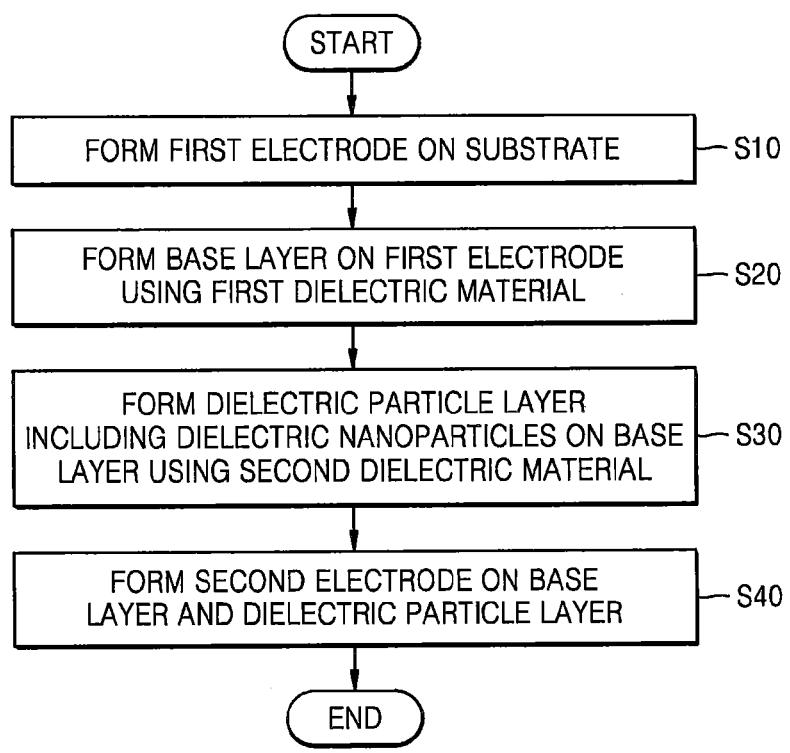
FIG. 8 is a flow-chart diagram illustrating a method of manufacturing a capacitor structure according to example embodiments of the inventive concepts.

FIG. 8 is a flow-chart diagram illustrating a method of manufacturing a capacitor structure according to example embodiments of the inventive concepts.

Figure 9A:
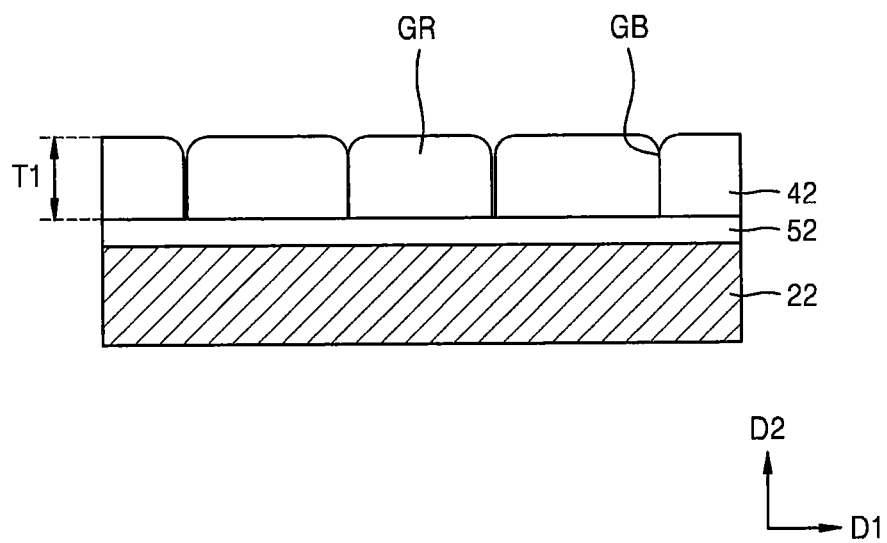
FIGS. 9A and 9B are cross-sectional views illustrating operations or stages of a method of manufacturing a capacitor structure according to example embodiments of the inventive concepts.
Figure 9B:
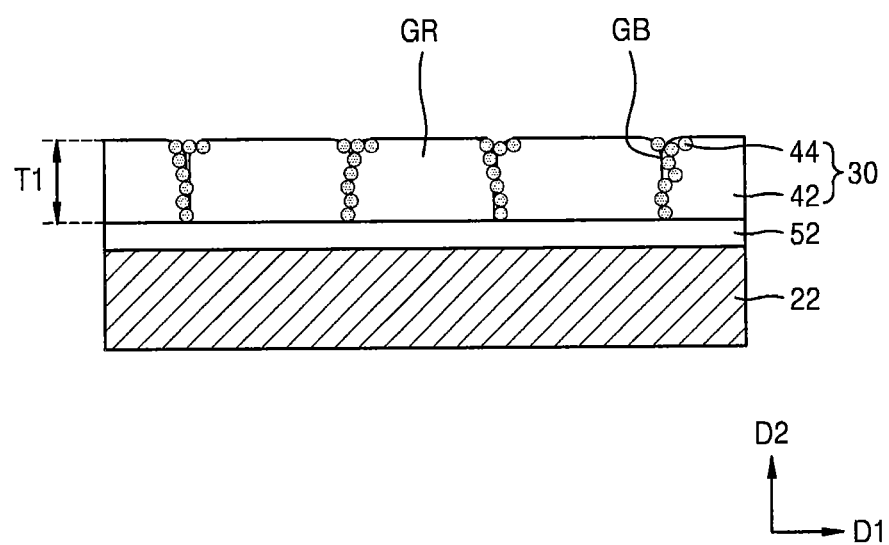

FIGS. 9A and 9B are cross-sectional views illustrating operations or stages of a method of manufacturing a capacitor structure according to example embodiments of the inventive concepts. FIGS. 9A and 9B may illustrate a method of the manufacturing the capacitor structure 10 as described with reference to FIG. 1.

Referring to FIGS. 8 and 9A, in operation S10, a first electrode 22 may be formed on a substrate.

In some embodiments, the first electrode 22 may be formed of one or more of doped polysilicon, metal such as ruthenium (Ru), iridium (Ir), titanium (Ti), tantalum (Ta), tungsten (W), conductive metal nitride such as titanium nitride (TiN), tantalum nitride (TaN), tungsten nitride (WN), and conductive metal oxide such as iridium oxide, etc. For example, the first electrode 22 may be formed by a LPCVD process, a PECVD process, a UHV-CVD process, an ALD process, a metal organic CVD (MOCVD) process, or a metal organic ALD (MOALD) process.

A first interface layer 52 may be formed on the first electrode 22. The first interface layer 52 may include an electrically conductive transition metal oxide, e.g., titanium oxide ($TiO_x$, $0<x<2$), titanium aluminum oxide ($TiAlO_x$), manganese oxide ($MnO_x$, $0<x<2$), or TiON, and may be formed to a thickness of about 1 Å to about 10 Å.

In operation S20, a base layer 42 may be formed, using a first dielectric material, on the first electrode 22 on which the first interface 52 is formed.

In some embodiments, the base layer 42 may be formed by a LPCVD process, a PECVD process, a UHV-CVD process, an ALD process, a MOCVD process, or a MOALD process. The first dielectric material may be a high-k dielectric material such as metal oxide and may have a dielectric constant of about 4 to about 40. For example, the first dielectric material may include one or more of zirconium oxide ($ZrO_2$), hafnium oxide ($HfO_2$), zirconium silicon oxide ($ZrSiO_x$), hafnium silicon oxide ($HfSiO_x$), zirconium hafnium silicon oxide ($ZrHfSiO_x$), aluminum oxide ($Al_2O_3$) and a combination thereof.

The base layer 42 may be formed to a first thickness T1 along a second direction D2 vertical or perpendicular to a top surface of the first electrode 22, and the first thickness T1 may range from about 10 Å to about 200 Å, but not limited thereto.

The base layer 42 may include a plurality of crystal grains GR. The crystal grains GR may have or may extend with the first thickness T1 in the second direction D2. A boundary or an interface between the crystal grains GR may be referred to as a grain boundary GB. In embodiments in which the base layer 42 includes a material having a high surface roughness, the base layer 42 may have an uneven, discontinuous top surface profile around the grain boundary GB.

Referring to FIGS. 8 and 9B, in operation S30, a dielectric particle layer 44 may be formed at or along at least a portion of the grain boundary GB using the second dielectric material.

In some embodiments, the second dielectric material may be different from the first dielectric material. The second dielectric material may have a high band gap energy (Eg), such as silicon oxide or metal oxide, and a smaller dielectric constant than the first dielectric material. For example, the second dielectric material may have the dielectric constant of about 3.9 to about 40 and the band gap energy (Eg) of about 5 to about 10 By. In some embodiments, the second dielectric material include one or more of aluminum oxide ($AL_2O_3$), Beryllium oxide (BeO), boron oxide ($B_2O_3$), silicon oxide ($SiO_2$), scandium oxide ($Sc_2O_3$), yttrium oxide ($Y_2O_3$), lanthanum oxide ($La_2O_3$), zirconium hafnium silicon oxide (ZrHfSiOx), aluminum nitride (AlN), boron nitride (BN), silicon nitride ($Si_3N_4$) or combinations thereof, but not limited thereto.

In some embodiments, the dielectric particle layer 44 may be formed by a LPCVD process, a PECVD process, a UHV-CVD process, an ALD process, a MOCVD process, or a MOALD process at a low pressure and low temperature atmosphere. For example, the dielectric particle layer 44 may be formed at a temperature of about 0° C. to about 350° C. and at a pressure of about 80 Pa to about 200 Pa, but not limited thereto.

In some embodiments, the dielectric particle layer 44 may be formed by repeating a plurality of times a deposition cycle including supplying a precursor including the second dielectric material, purging, supplying a reactant gas, and purging. In other embodiments, the dielectric particle layer 44 may be formed by repeating a plurality of times a deposition cycle including a first supply of the precursor, a purge, a second supply of the precursor, a purge, a first supply of the reactant gas, purge, a second supply of the reactant gas, and purge. However, aspects of the inventive concepts are not limited thereto.

In some embodiments, the precursor may include trimethylaluminum (TMA), triethyaluminum (TEA), trimethylborane (TMB) or triethylborane (TEB), but not limited thereto.

As shown in FIG. 9B, the dielectric particle layer 44 may include dielectric nanoparticles dispersed at the grain boundary of the base layer 42. That is, the dielectric material particles may contact the grain boundary GB of the base layer 44 and may be disposed adjacent to the grain boundary GB. The dielectric nanoparticles may be disposed on a top surface of the base layer 42. Some of the dielectric nanoparticles in the dielectric particle layer 44 may be in contact with each other and may agglomerate each other. Some of the dielectric nanoparticles may randomly be dispersed.

In some embodiments, the dielectric nanoparticles have a diameter of about 1 Å to 10 Å and may have a spherical shape, a hemispherical shape, an elliptical shape or a dot-shape. The dielectric nanoparticles may be preferentially formed along the grain boundary GB, and thus the capacitor dielectric layer 30 including the base layer 42 and the dielectric particle layer 44 may have a flat or substantially planar top surface profile.

Next, referring to FIGS. 8 and 1, in operation S40, a second electrode 24 may be formed on the base layer 42 and the dielectric particle layer 44.

The second electrode 24 may be formed of one or more of doped polysilicon, metal such as ruthenium (Ru), iridium (Ir), titanium (Ti), tantalum (Ta), tungsten (W), conductive metal nitride such as titanium nitride (TiN), tantalum nitride (TaN), tungsten nitride (WN), and conductive metal oxide such as iridium oxide, etc. For example, the second electrode 22 may be formed by a LPCVD process, a PECVD process, a UHV-CVD process, an ALD process, a MOCVD process, or a MOALD process.

Before forming the second electrode 24, a second interface layer 54 may be selectively formed on the base layer 42 and the dielectric particle layer 44. The second interface layer 54 may be formed by a process similar to the process of forming the first interface layer 52. The second interface layer 54 may act as a barrier layer to reduce or prevent oxygen atoms in the base the base layer 42 and the dielectric particle layer 44 form diffusing into the second electrode 24 while forming the second electrode 24.

The capacitor structure 10 may be formed by the above-described processes.

According to some methods of manufacturing the capacitor structure 10, the dielectric particle layer 44 including the dielectric nanoparticles may be formed at the grain boundary GB of the base layer 42. The dielectric nanoparticles may be disposed in a space between the crystal grains GR of the base layer 42 and may continuously extend along a thickness direction of the capacitor dielectric layer 30. Thus, the capacitor structure 10 may have a high capacitance although the thickness T1 of the capacitor dielectric layer 30 is small.

Further, although the base layer 42 has a high surface roughness, the nanoparticles may be disposed in the space between the crystal grains GR such that the capacitor dielectric layer 30 may have a flat or substantially planar top surface profile and a low surface roughness. Accordingly, a leakage current or a short circuit between the first and second electrodes 22 and 24 through the capacitor dielectric layer 30 may be reduced or prevented from occurring and a breakdown of the capacitor dielectric layer 30 may also be reduced or prevented from occurring.

Figure 10:
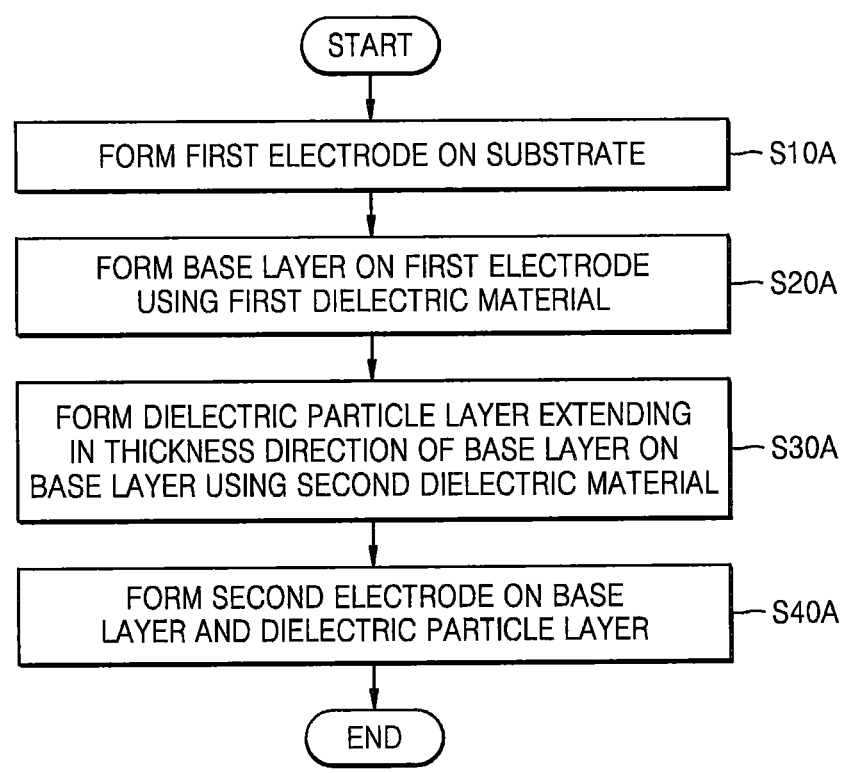
FIG. 10 is a flow-chart diagram illustrating a method of manufacturing a capacitor structure according to example embodiments of the inventive concepts.
Figure 11A:
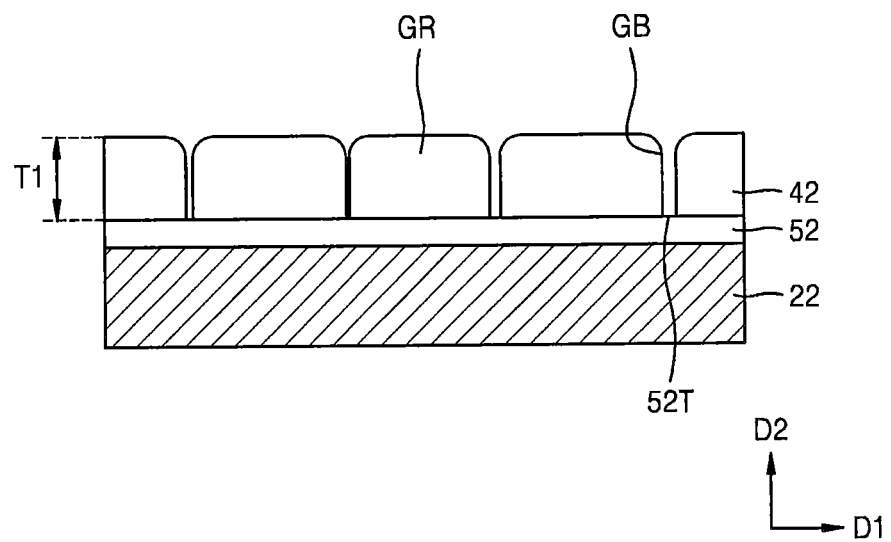
FIGS. 11A and 11B are cross-sectional views illustrating operations or stages of a method of manufacturing a capacitor structure according to example embodiments of the inventive concepts.
Figure 11B:
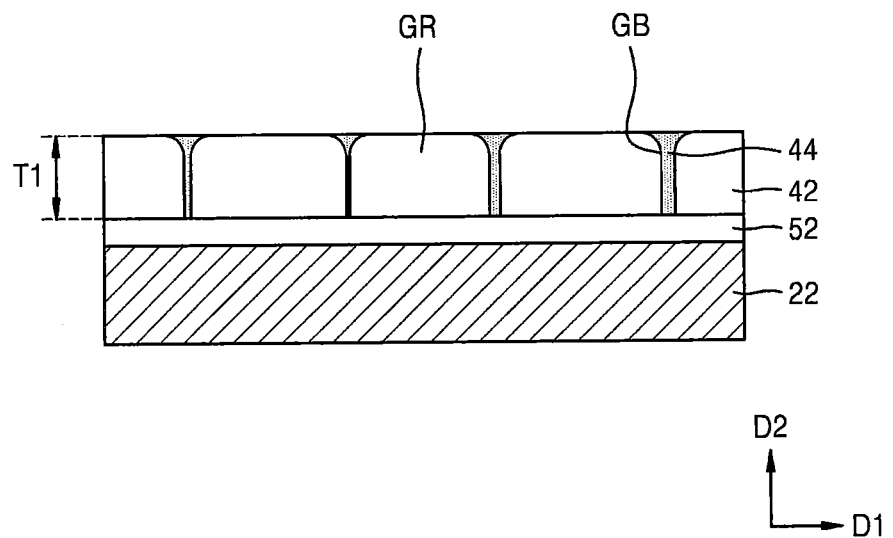

FIG. 10 is a flow-chart diagram illustrating a method of manufacturing a capacitor structure according to example embodiments of the inventive concepts;

FIGS. 11A and 11B are cross-sectional views illustrating operations or stages of a method of manufacturing a capacitor structure according to example embodiments of the inventive concepts. In FIGS. 11A and 11B, the same reference numerals denote the same elements as in FIGS. 1 to 9B.

Referring to FIGS. 10 and 11A, in operation S10A, a first electrode 22 may be formed on a substrate.

In operation S20A, a base layer 42 may be formed on the first electrode 22 using a first dielectric material. The base layer 42 may include a plurality of crystal grains GR extending a second direction D2 vertical or perpendicular to a top surface of the first electrode 22. A top surface 52T of a first interface layer 52 may be exposed between the crystal grains GR (or the top surface of the first electrode 22 may be exposed between the crystal grains GR in embodiments in which the first interface 52 is not formed).

Referring to FIGS. 10 and 11B, in operation S30A, a dielectric particle layer 44 may be formed at or extending along at least a portion of a grain boundary GB of the base layer 42 using a second dielectric material.

In some embodiments, the dielectric particle layer 44 may be formed to have a pillar shaped cross-section and extend in the second direction D2 (e.g., a thickness direction of the base layer 42). A bottom surface of the dielectric particle layer 44 may contact the top surface 52T of the first interface layer 52 (or the first electrode 22 in embodiments where the first interface layer 52 is not present).

In some embodiments, the dielectric particle layer 44 may be formed using a material having an improved gap-fill property as the second dielectric material, and thus may fill a space between the crystal grains GR of the base layer 42 without a void. In other embodiments, the dielectric particle layer 44 may be formed by a flowable CVD process and the following annealing process to fill the space between the crystal grains GR without the void. However, aspects of the present inventive concepts are not limited thereto.

After selectively controlling a surface roughness of the first interface layer 52, the base layer 42 may be formed on the first interface layer 52 such that the top surface 52T of the first interface layer 52 is exposed in the space between the crystal grains GR of the base layer 42. Next, the dielectric particle layer 44 may be formed to fill the space between the crystal grains GR of the base layer 42.

Depending on morphology or a surface roughness of the crystal grains GR of the base layer 42, a width between the crystal grains GR may be the same or vary along the thickness direction of the base layer 42. For example, the crystal grains GR of the base layer 42 may be preferentially formed along the second direction D2, and thus the space between the crystal grains GR may be substantially uniform or may have substantially the same width. In this case, the dielectric particle layer 44A described with reference to FIG. 2 may be formed to have a substantially uniform width W1 (refer to FIG. 2) along the thickness direction of the base layer 42 and a pillar shaped cross-section. In some embodiments, when the surface roughness of the base layer 42 is high, a width W3 (refer to FIG. 3) between the crystal grains GR of an upper portion of the base layer 42 may be greater than a width W2 (refer to FIG. 3) between the crystal grains GR of a lower portion of the base layer 42. In this case, the dielectric particle layer 44B described with reference to FIG. 3 may be formed to have a width varying along the thickness direction of the base layer 42 and a pillar shaped cross-section.

Next, in operation S40A, a second electrode 24 (refer to FIG. 3) may be formed on the base layer 42 and the dielectric particle layer 44.

Figure 12:
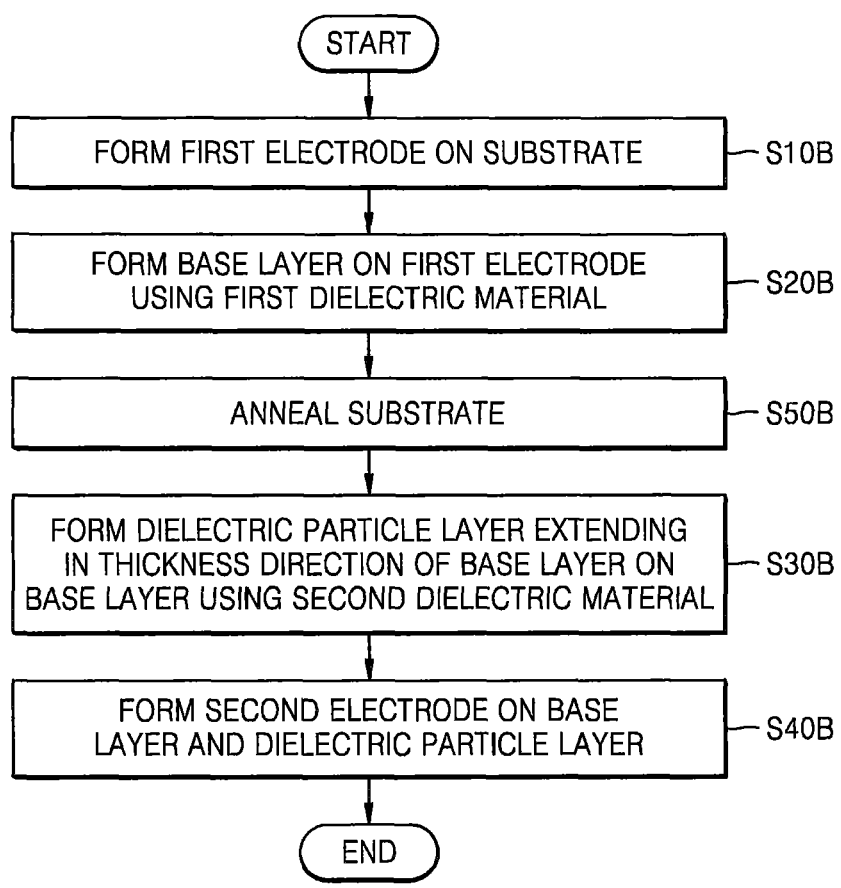
FIG. 12 is a flow-chart diagram illustrating a method of manufacturing a capacitor structure according to example embodiments of the inventive concepts.
Figure 13A:
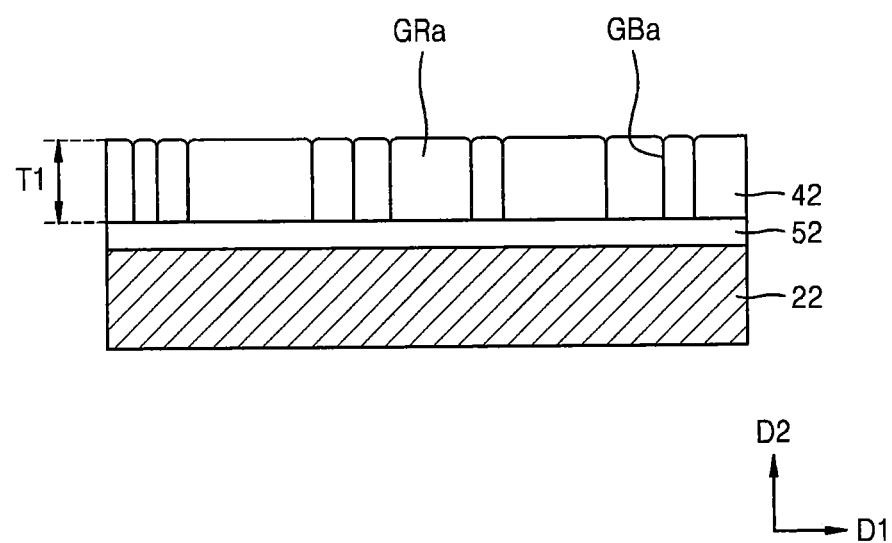
FIGS. 13A to 13C are cross-sectional views illustrating operations or stages of a method of manufacturing a capacitor structure according to example embodiments of the inventive concepts.
Figure 13B:
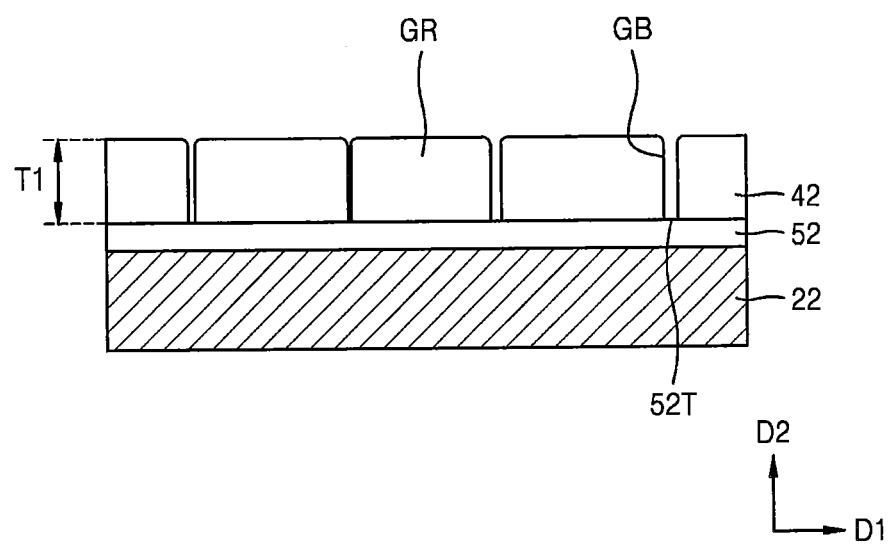
Figure 13C:
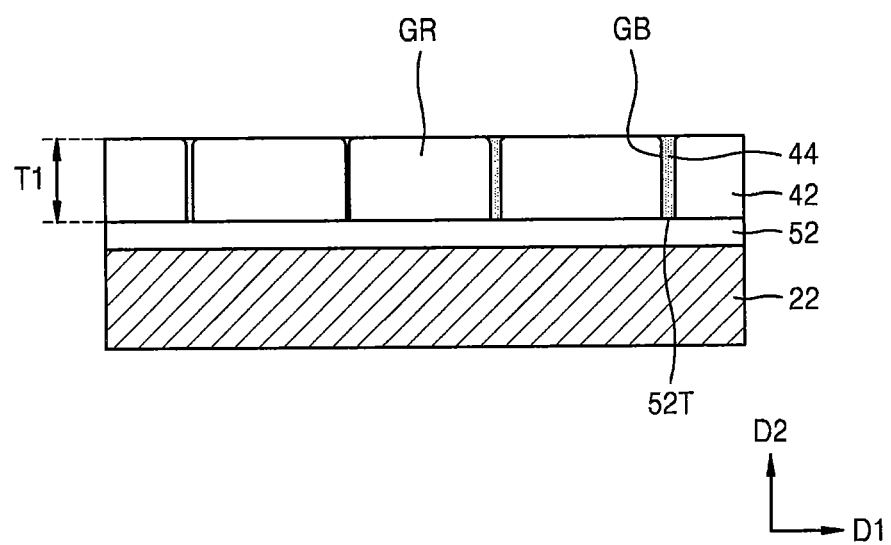

FIG. 12 is a flow-chart diagram illustrating a method of manufacturing a capacitor structure according to example embodiments of the inventive concepts;

FIGS. 13A to 13C are cross-sectional views illustrating operations or stages of a method of manufacturing a capacitor structure according to example embodiments of the inventive concepts. In FIGS. 13A to 13C, the same reference numerals denote the same elements as in FIGS. 1 to 11B.

Referring to FIGS. 12 and 13A, in operation S10B, a first electrode 22 may be formed on a substrate.

In operation S20B, a base layer 42 may be formed on the first electrode 22 using a first dielectric material.

In some embodiments, the base layer 42 may be formed by a process performed at a relatively low pressure and a relatively low temperature. Thus, a width or a diameter of the crystal grains GRa of the base layer 42 in a first direction D1 may be small, and/or crystallinity of the crystal grains GRa of the base layer 42 may be low. Also, grain boundaries GBa between the crystal grains GRa may be formed in a higher density. However, aspects of the inventive concepts are not limited thereto.

Referring to FIGS. 12 and 13B, in operation S50B, an annealing process on the substrate may be performed.

The annealing process may be performed at about 100° C. to about 1000° C. for several seconds to several hours. The annealing process may include a rapid thermal annealing (RTA) process or a laser annealing process, but embodiments of the inventive concepts are not limited thereto.

By the annealing process, a size of the crystal grains GR of the base layer 42 may be increased. For example, the crystal grains GRa (refer to FIG. 13A) having a small width or a small diameter may be merged with the adjacent crystal grains GRa such that larger crystal grains GR may be grown. Thus, according to the growth of the crystal grains GR, the grain boundary GB may be relocated. For example, as shown in FIG. 13B, according to the growth of the crystal grains GR, a space between the crystal grains GR may be enlarged, and thus a top surface 52T of a first interface layer 52 may be exposed.

Referring to FIGS. 12 and 13C, in operation S30B, a dielectric particle layer 44 may be formed in the base layer 42 using a second dielectric material. As described with reference to FIG. 11B, the dielectric particle layer 44 may have a substantially uniform width in a thickness direction of the base layer 42 and a pillar shaped cross-section. In some embodiments, the dielectric particle layer 44 may have a pillar shaped cross-section of which an upper width is larger than a lower width.

Next, in operation S40B, a second electrode 24 (refer to FIG. 3) may be formed on the base layer 42 and the dielectric particle layer 44.

Figure 14:
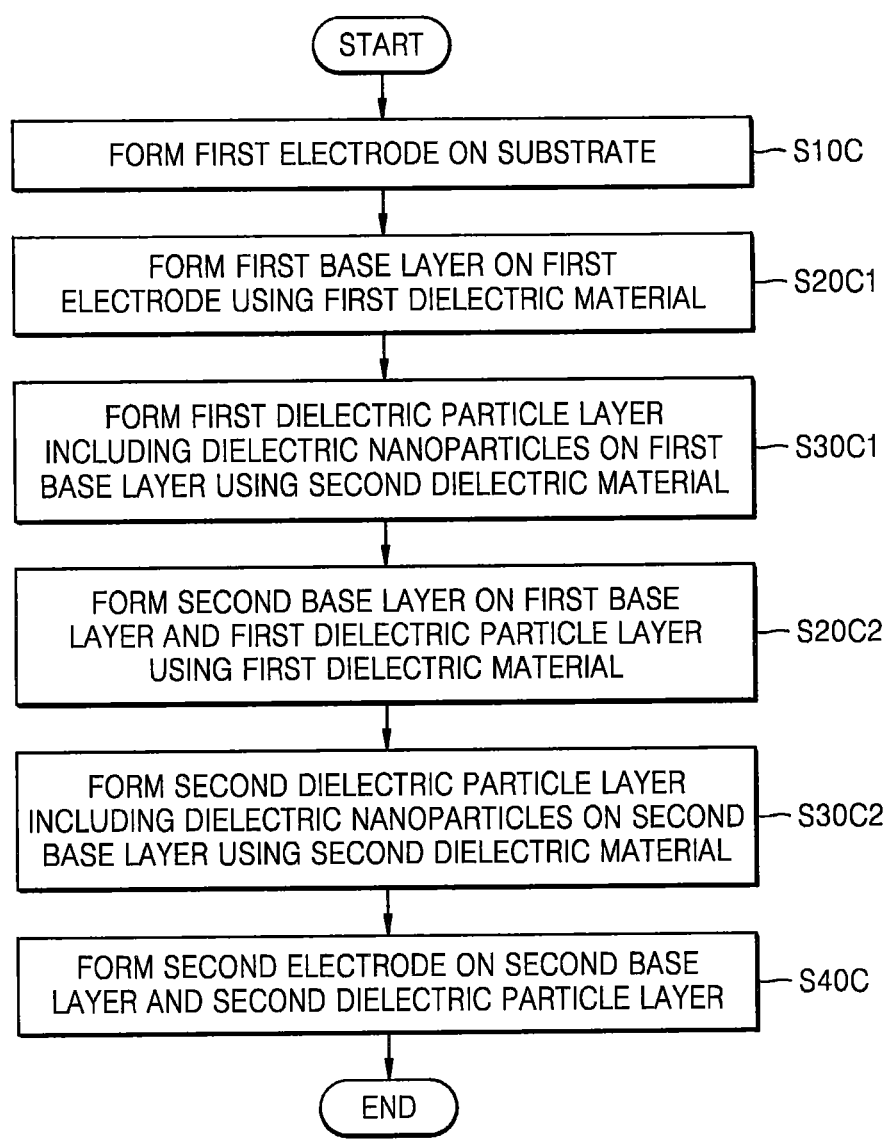
FIG. 14 is a flow-chart diagram illustrating a method of manufacturing a capacitor structure according to example embodiments of the inventive concepts.
Figure 15A:
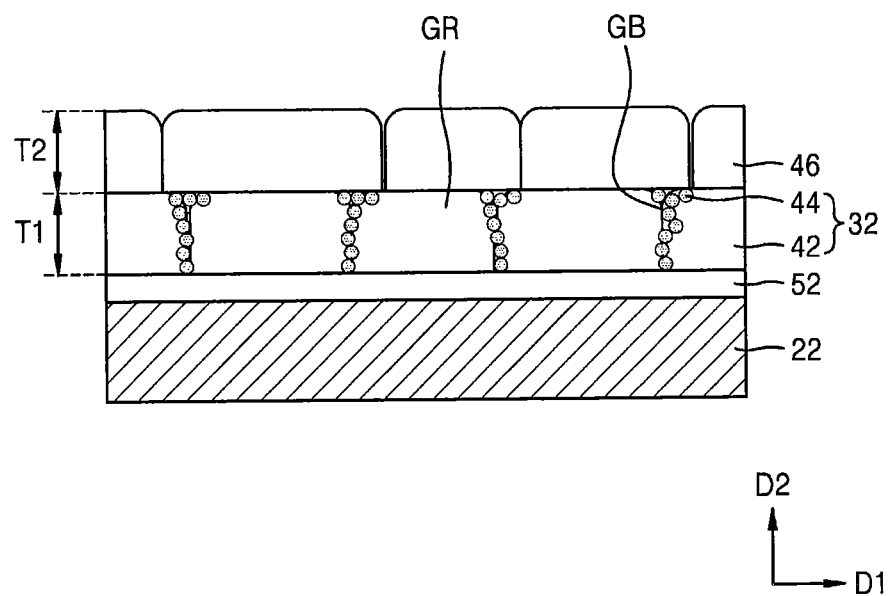
FIGS. 15A and 15B are cross-sectional views illustrating operations or stages of a method of manufacturing a capacitor structure according to example embodiments of the inventive concepts.
Figure 15B:
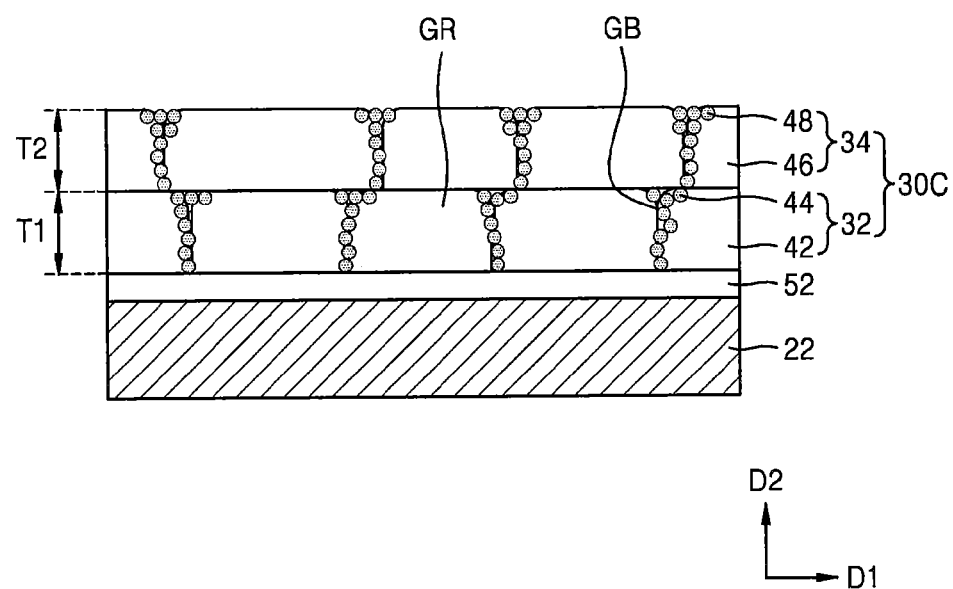

FIG. 14 is a flow-chart diagram illustrating a method of manufacturing a capacitor structure according to example embodiments of the inventive concepts;

FIGS. 15A and 15B are cross-sectional views illustrating operations or stages of a method of manufacturing a capacitor structure according to example embodiments of the inventive concepts. In FIGS. 15A and 15B, the same reference numerals denote the same elements as in FIGS. 1 to 13C.

Referring to FIGS. 14 and 15A, a first electrode 22 may be formed on a substrate (operation S10C), a first base layer 42 may be formed on the first electrode 22 using a first dielectric material (operation S20C1), and a first dielectric particle layer 44 may be formed at or extending along at least a portion of a grain boundary GB of the first base layer 42 using a second dielectric material (operation S30C1).

Here, the first base layer 42 and the first dielectric particle layer 44 may be referred to as a first dielectric layer 32.

Further details of the formation of the first dielectric layer 32 may refer the detailed descriptions with reference to FIGS. 8 to 9B.

Next, in operation S20C2, a second base layer 46 may be formed on the first base layer 42 and the first dielectric particle layer 44. Here, the first dielectric layer 32 may include the first base layer 42 and the first dielectric particle layer 44, and thus may have a flat or substantially planar top surface profile. For example, since the first dielectric particle layer 44 may include dielectric nanoparticles arranged to continuously or substantially continuously extend along a grain boundary GB of the first base layer 42, the first dielectric layer 32 may have a low surface roughness of about 0.3 nm or less.

The second base layer 46 may be formed by a process similar to the process of forming the first base layer 42. The second base layer 46 may be formed to have an improved crystallinity because the second base layer 46 is formed on the first dielectric layer 32 having the low surface roughness.

Referring to FIGS. 14 and 15B, in operation S30C2, a second dielectric particle layer 48 may be formed at or extending along at least a portion of a grain boundary GB of the second base layer 46 using the second dielectric material.

Here, the second base layer 46 and the second dielectric particle layer 48 may be referred to as a second dielectric layer 34. The second dielectric particle layer 48 may be formed by a process similar to the process of forming the first dielectric particle layer 44. In some embodiments, a first thickness T1 of the first dielectric layer 32 may be equal to or different from a second thickness T2 of the second dielectric layer 34.

As a result, a capacitor dielectric layer 30C including stacked first and second dielectric layers 32 and 34 may be formed.

Next, in operation S40C, a second electrode 24 (refer to FIG. 4) may be formed on the second base layer 46 and the second dielectric particle layer 48.

As shown in FIGS. 15A and 15B, the first and second dielectric particle layers 44 and 48 may include the dielectric nanoparticles, but embodiments of the inventive concepts are not limited thereto. For example, one or more of the first second dielectric particle layers 44 and 48 may be formed to have a pillar shaped cross-section continuously filling spaces between the crystal grains GR of the base layers 42 and 46.

Figure 16:
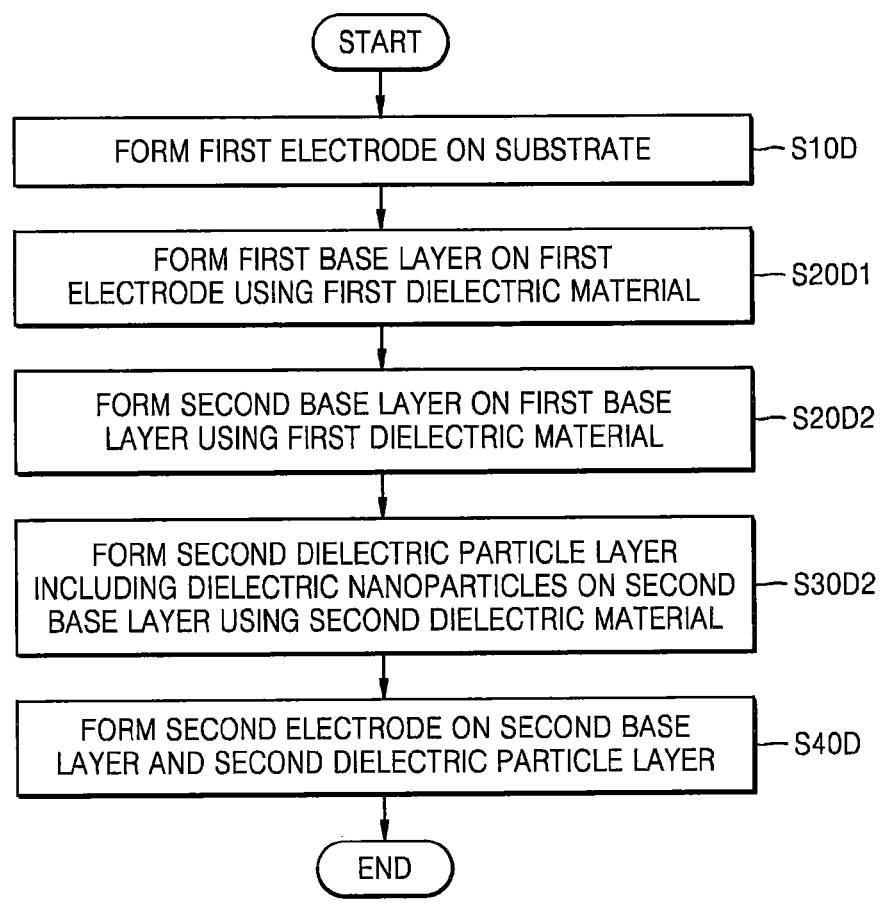
FIG. 16 is a flow-chart diagram illustrating a method of manufacturing a capacitor structure according to example embodiments of the inventive concepts.
Figure 17A:
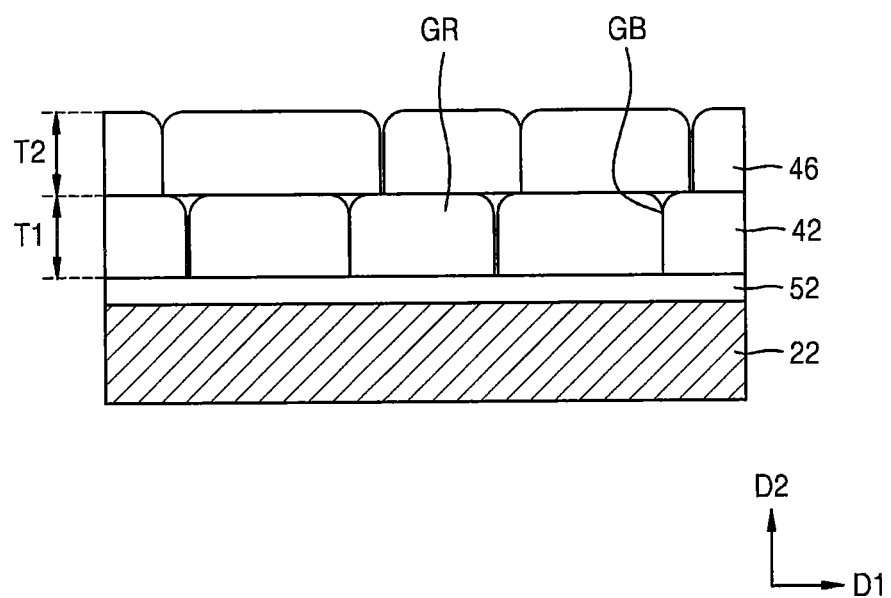
FIGS. 17A and 17B are cross-sectional views illustrating operations or stages of a method of manufacturing a capacitor structure according to example embodiments of the inventive concepts.
Figure 17B:
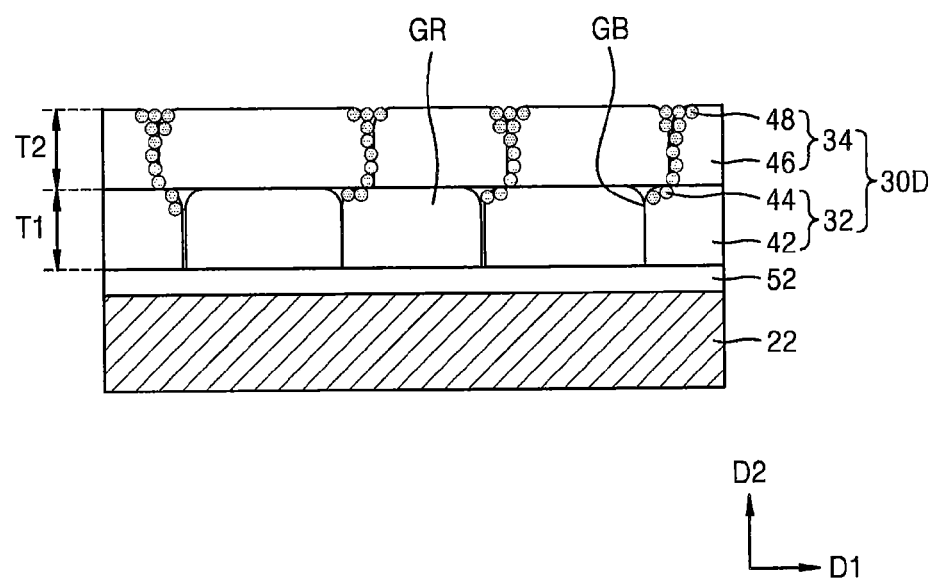

FIG. 16 is a flow-chart diagram illustrating a method of manufacturing a capacitor structure according to example embodiments of the inventive concepts;

FIGS. 17A and 17B are cross-sectional views illustrating operations or stages of a method of manufacturing a capacitor structure according to example embodiments of the inventive concepts. In FIGS. 17A and 17B, the same reference numerals denote the same elements as in FIGS. 1 to 15B.

Referring to FIGS. 16 and 17A, a first electrode 22 may be formed on a substrate (operation S10D), and a first base layer 42 may be formed on the first electrode 22 using a first dielectric material (operation S20D1).

Next, in operation S20D2, the second base layer 46 may be formed using the first dielectric material. The second base layer 46 may be formed by a process similar to the process of forming the first base layer 42.

In the process of forming the second base layer 46, a space between crystal grains GR of the first base layer 42 may not be partially filled, and thus a void may be formed at a portion of the space of the crystal grains GR of the first base layer 42. Further, a grain boundary GB of the second base layer 46 may be disposed adjacent to a grain boundary GB of the first base layer 42. For example, since the first base layer 42 may have an uneven, discontinuous top surface profile around the grain boundary GB, a growth of the crystal grain GR of the second base layer 46 on the grain boundary GB of the first base layer 42 may be suppressed. However, aspects of the present inventive concepts are not limited thereto.

Referring to FIGS. 16 and 17B, in operation S30D2, a second dielectric particle layer 48 including dielectric nanoparticles may be formed at or extending along at least a portion of a grain boundary GB of the second base layer 46 using a second dielectric material.

In some embodiments, the second dielectric particle layer 48 may be formed by a process similar to the process of forming the dielectric particle layer 44 as described with reference to FIGS. 8 and 9B.

In the process of forming the second dielectric particle layer 48, the dielectric nanoparticles may diffuse or move along the space between the crystal grains GR of the second base layer 46, and thus may be disposed at the grain boundary GB of an upper portion of the first base layer 42 such that a first dielectric particle layer 44 may be formed.

As shown in FIG. 17B, the first dielectric particle layer 44 may be disposed at only the grain boundary GB of the upper portion of the first base layer 42. For example, the first dielectric particle layer 44 may be formed only up to a predetermined height from a top surface of the first dielectric layer 32 but may not be formed at the grain boundary GB of a lower portion of the first base layer 42.

As a result, a capacitor dielectric layer 30D including the stacked first and second dielectric layers 32 and 34 may be formed.

FIGS. 18A to 18H are cross-sectional views illustrating operations or stages of a method of manufacturing a semiconductor device 100 according to example embodiments of the inventive concepts. The manufacturing method may be a method of manufacturing the semiconductor device 100 as described with reference to FIGS. 6A and 6B.

Figure 18A:
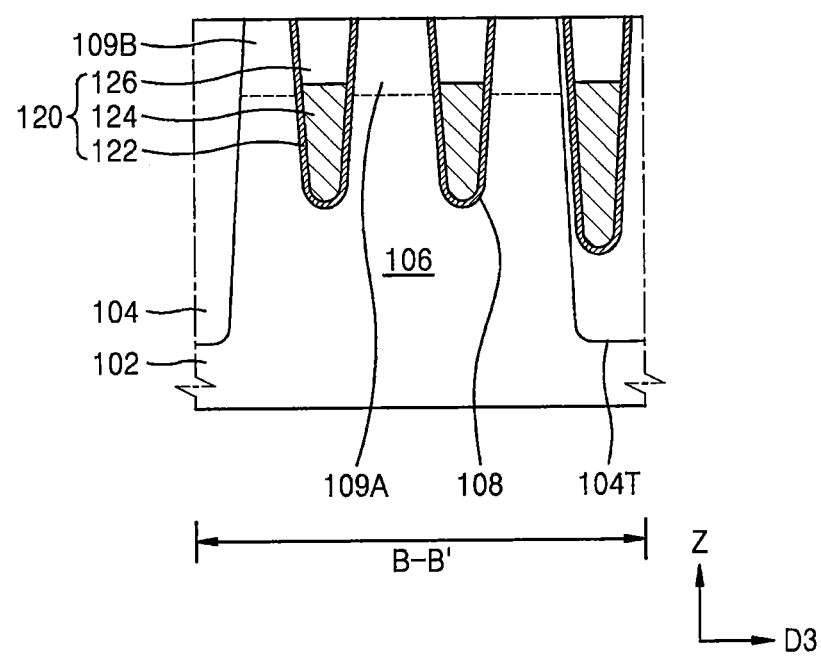
FIGS. 18A to 18H are cross-sectional views illustrating operations or stages of a method of manufacturing a semiconductor device according to example embodiments of the inventive concepts.

Referring to FIG. 18A, a trench 108 may be formed in a substrate 102 including an active region 106 to extend in an X direction (refer to FIG. 6A) parallel to a top surface of the substrate 102 and cross the active region 106.

An isolation trench 104T is formed in the substrate 102, and an isolation layer 104 may be formed in the isolation trench 104T. The active region 106 may be defined in the substrate 102 by the isolation layer 104. The active region 10 may have a long island shape that has a short axis and a long axis as the active region 106 shown in FIG. 6A. Further details of the substrate 102 may be the same as described with reference to FIGS. 6A and 6B. The isolation layer 104 may include a single insulating layer or multiple layers formed of a combination of at least two types of insulating layers.

In some embodiments, first and second source/drain regions 109A and 109B may be formed in an upper portion of the active region 106 by implanting impurity ions in the substrate 102. In other embodiments, after forming a gate structure 120 filling the trench 108, the source/drain regions 109A and 109B may be formed at opposite sides of the gate structure 120.

A first mask may be formed on the substrate 102, and then the trench 108 may be formed in the substrate 102 by etching the substrate 102 using the first mask as an etch mask. A plurality of the trenches 108 may be formed to extend parallel to each other, and each trench 108 may have a linear shape crossing the active region 106.

In some embodiments, by etching the substrate 102 and the isolation layer 104 using an etching condition in which an etch depth of the substrate 102 is different from an etch depth of the isolation layer 104, a bottom surface of the trench 108 may be formed to have a step. In some embodiments, to form the trench 108 having the stepped bottom surface, the isolation layer 104 and the substrate 102 may be etched using separate etching processes such that the etch depth of the isolation layer 104 may be different from the etch depth of the substrate 102.

Next, a gate insulating layer 122 may be formed on a bottom surface and an inner wall of the trench 108. The gate insulating layer 122 may include one or more of silicon oxide, silicon nitride, silicon oxynitride and a high-k dielectric material having a dielectric constant greater than silicon oxide.

After forming a gate conductive layer filling the trench 108, an upper portion of the gate conductive layer may be etched by an etch-back process to form a gate electrode 124. In some embodiments, the gate electrode 124 may include a work function adjustment layer formed on the gate insulating layer 122 and a buried metal layer formed on the work function adjustment layer to fill a lower portion of the trench 108. The work function adjustment layer may include metal, metal nitride, and/or metal carbide, such as Ti, TiN, TiAlN, TiAlC, TiAlCN, TiSiCN, Ta, TaN, TaAlN, TaAlCN, TaSiCN. The buried metal layer may include one or more of W, WN, TiN and TaN.

Next, an insulating material may be formed to fill a remaining portion of the trench 108, and the insulating material may be planarized until the top surface of the substrate 102 is exposed such that a gate capping layer 126 may be formed on the inner wall of the trench 108. Further, the first mask may be removed.

Figure 18B:
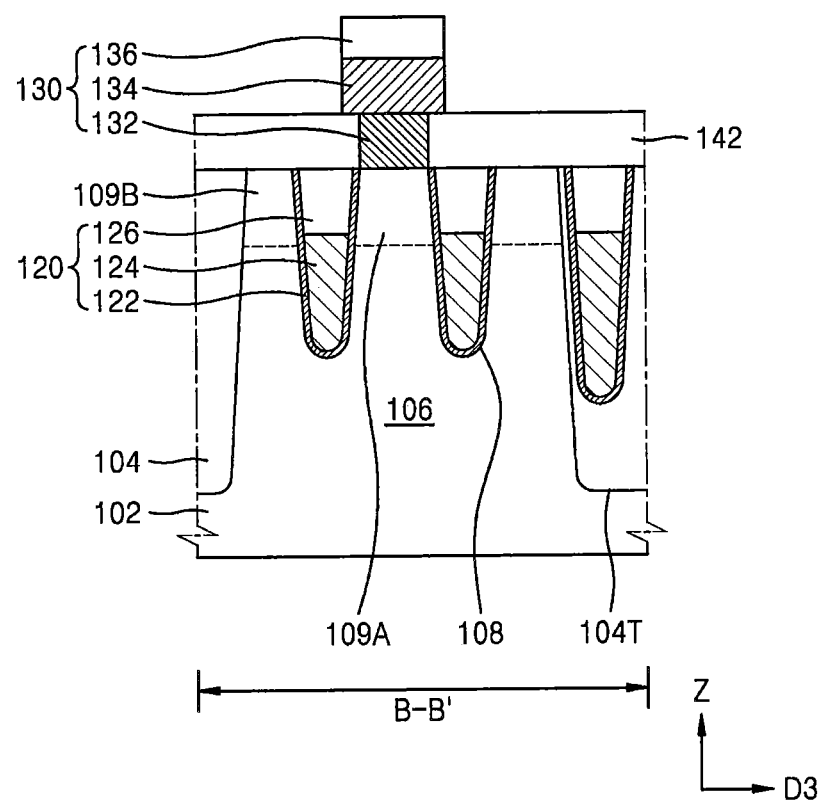

Referring to FIG. 18B, a first insulating interlayer 142 may be formed on the substrate 102, and an opening exposing the first source/drain region 109A may be formed in the first insulating interlayer 142. A conductive layer may be formed on the insulating layer 142 to fill the opening, and the conductive layer may be planarized such that a bit line contact 132 is formed in the opening to be electrically connected to the first source/drain region 109A.

Next, a first bit line 134 and a bit line capping layer 136 may be formed on the first insulating interlayer 142 to extend in a Y direction (refer to FIG. 6A) parallel to the top surface of the substrate 102 and vertical or perpendicular to the X direction. In some embodiments, a bit line spacer may be formed on sidewalls of the first bit line 134 and the bit line capping layer 136 and may further include an air space.

Figure 18C:
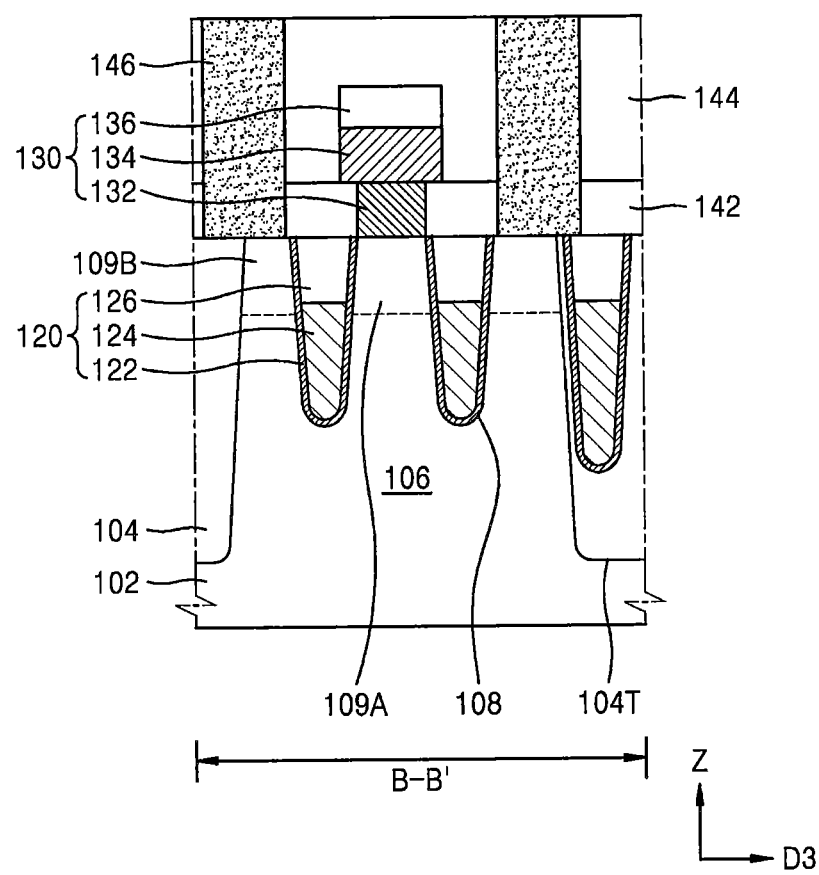

Referring to FIG. 18C, a second insulating interlayer 144 may be formed on the first insulating interlayer 142 to extend on or cover the bit line 134 and the bit line capping layer 136. A top surface of the second insulating interlayer 144 may be positioned at a level equal to or higher than a top surface of the bit line capping layer 136.

Next, an opening may be formed in the first and second insulating interlayers 142 and 144 to expose the second source/drain region 109B, and a contact structure 146 may be formed in the opening. For example, a lower contact pattern, a metal silicide layer, a barrier layer and an upper contact pattern may be sequentially formed in the opening such that the contact structure 146 may be formed to be electrically connected to the second source/drain region 109B.

Figure 18D:
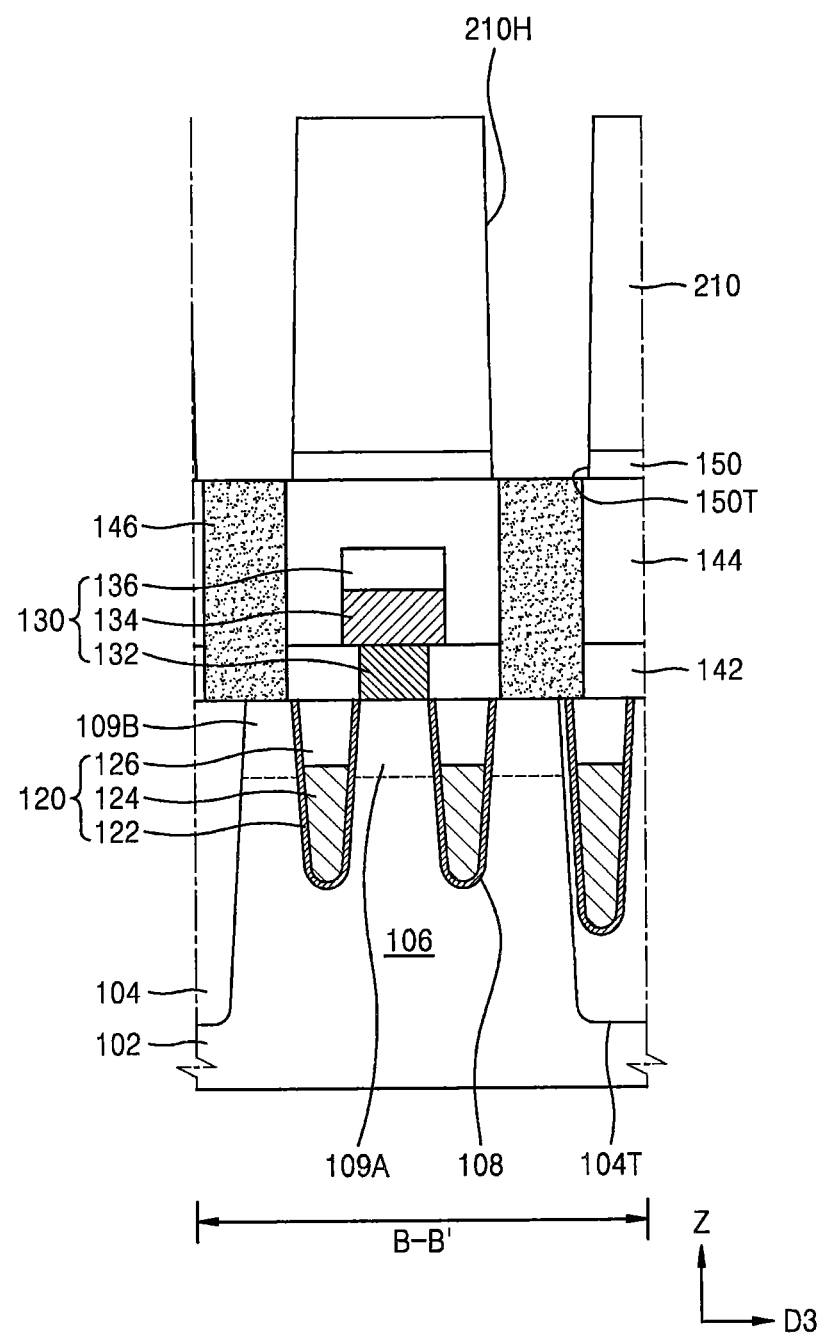

Referring to FIG. 18D, after sequentially forming an etch stop layer 150 and a mold layer 210 on the second insulating interlayer 144 and the contact structure 146, openings 210H and 150T may be formed in the mold layer 210 and the etch stop layer 150. The openings 210H and 150T may be integrally connected to each other and may expose a top surface of the contact structure 146.

In some embodiments, the mold layer 210 and the etch stop layer 150 may include materials having an etch selectivity with respect to each other. For example, when the mold layer 210 may include silicon oxide, the etch stop layer 150 may include silicon nitride. In some embodiments, the mold layer 210 may be formed of multiple layers including materials having different etch rates.

Figure 18E:
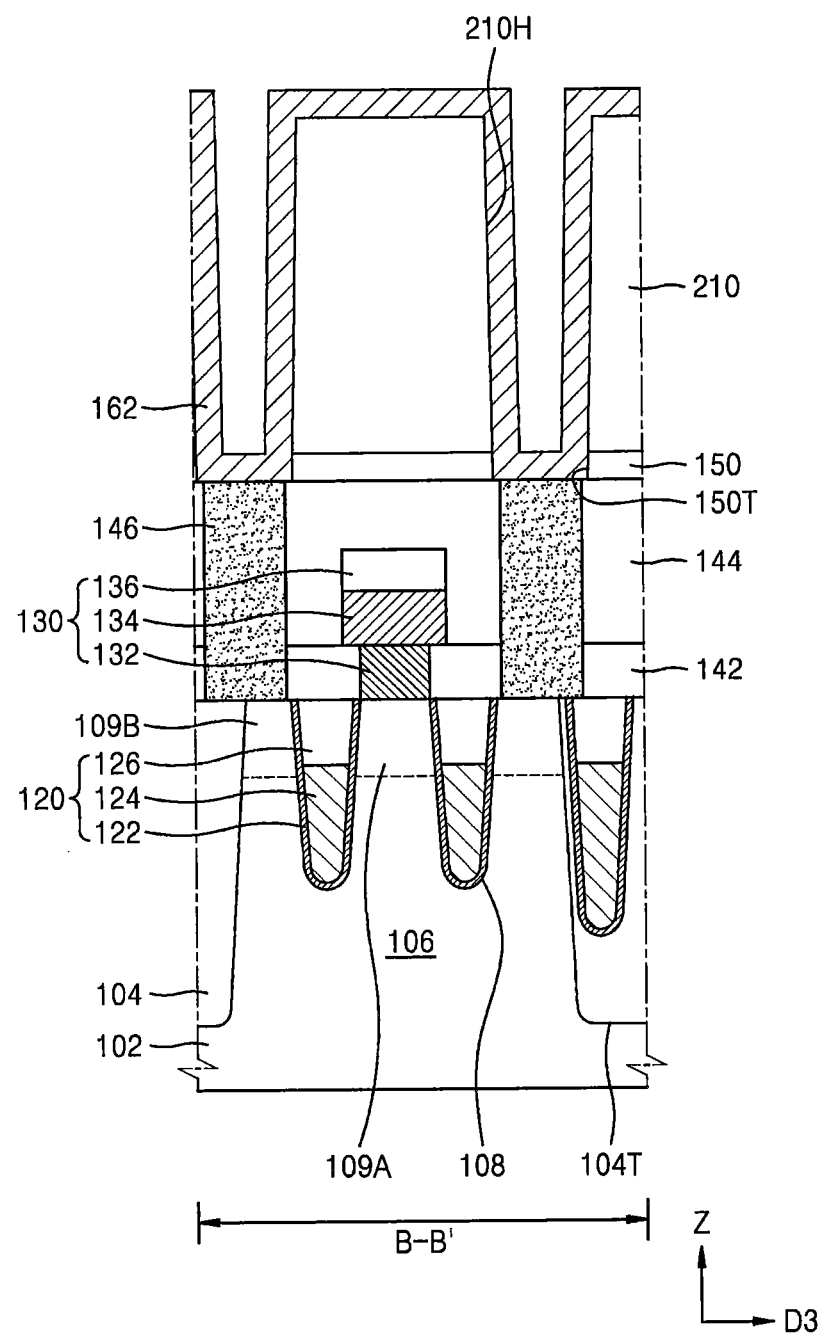

Referring to FIG. 18E, a lower electrode 162 may be formed on the mold layer 210 and the etch stop layer 150 to conformally extend on or cover inner surfaces of the openings 150T and 201H. The lower electrode 162 may be formed by a process similar to the process of forming the first electrode 22 as described with respect to FIGS. 8 and 9A.

Figure 18F:
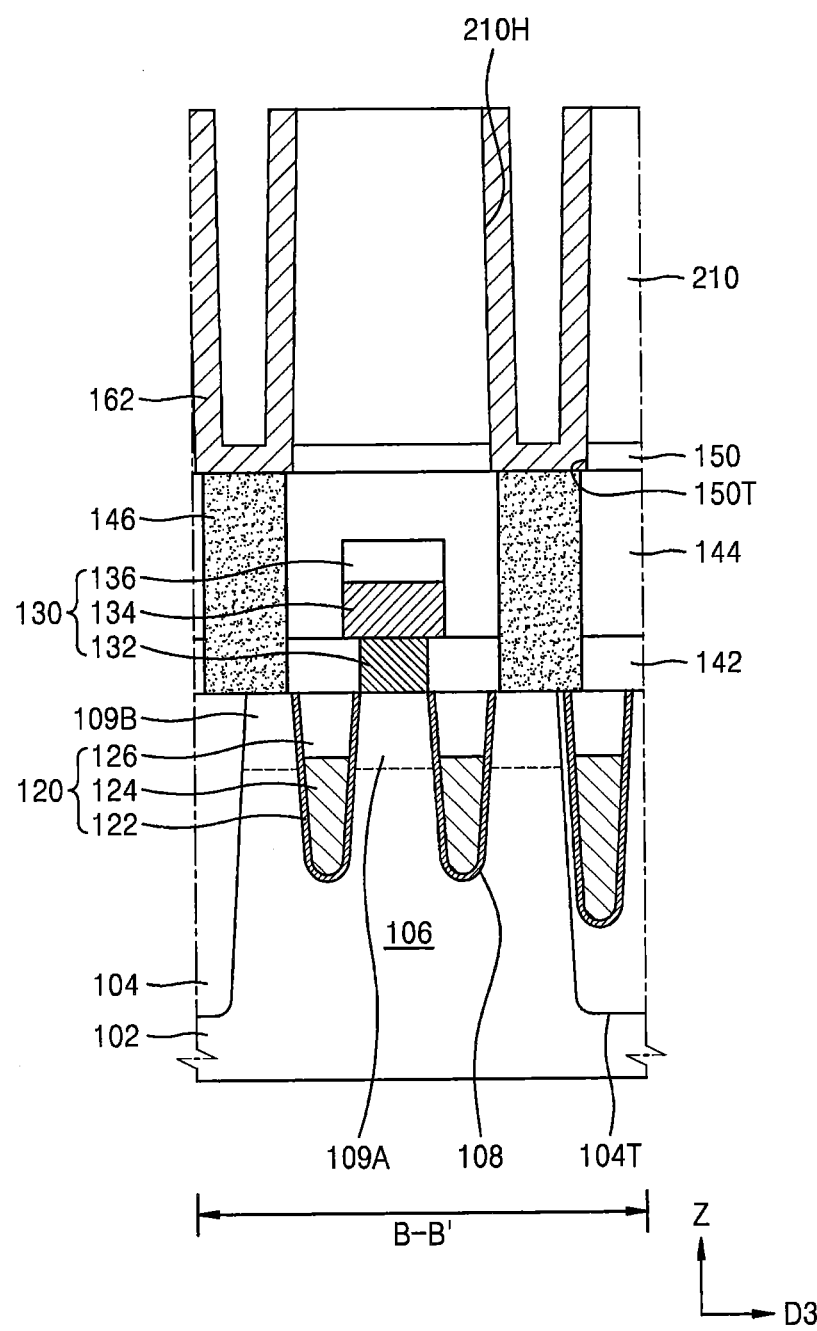

Referring to FIG. 18F, a portion of the lower electrode 162 on a top surface of the mold layer 210 may be removed by an etch-back process or a chemical mechanical polishing process.

Figure 18G:
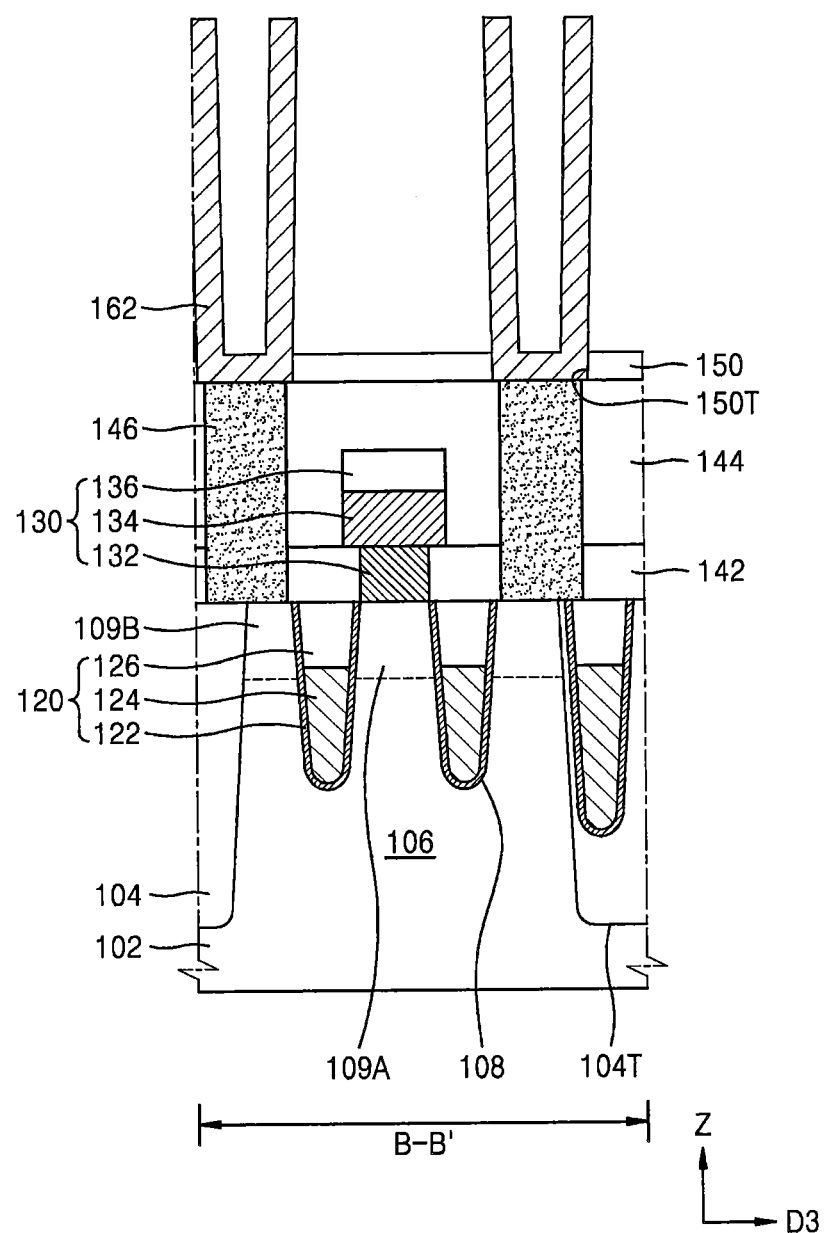

Referring to FIG. 18G, the mold layer 210 may be removed.

In the removal process of the mold layer 210, the etch stop layer 150 may remain without being removed. The lower electrode 162 may be disposed on the contact structure 146 and may be formed in a cylindrical shape having a closed bottom.

Figure 18H:
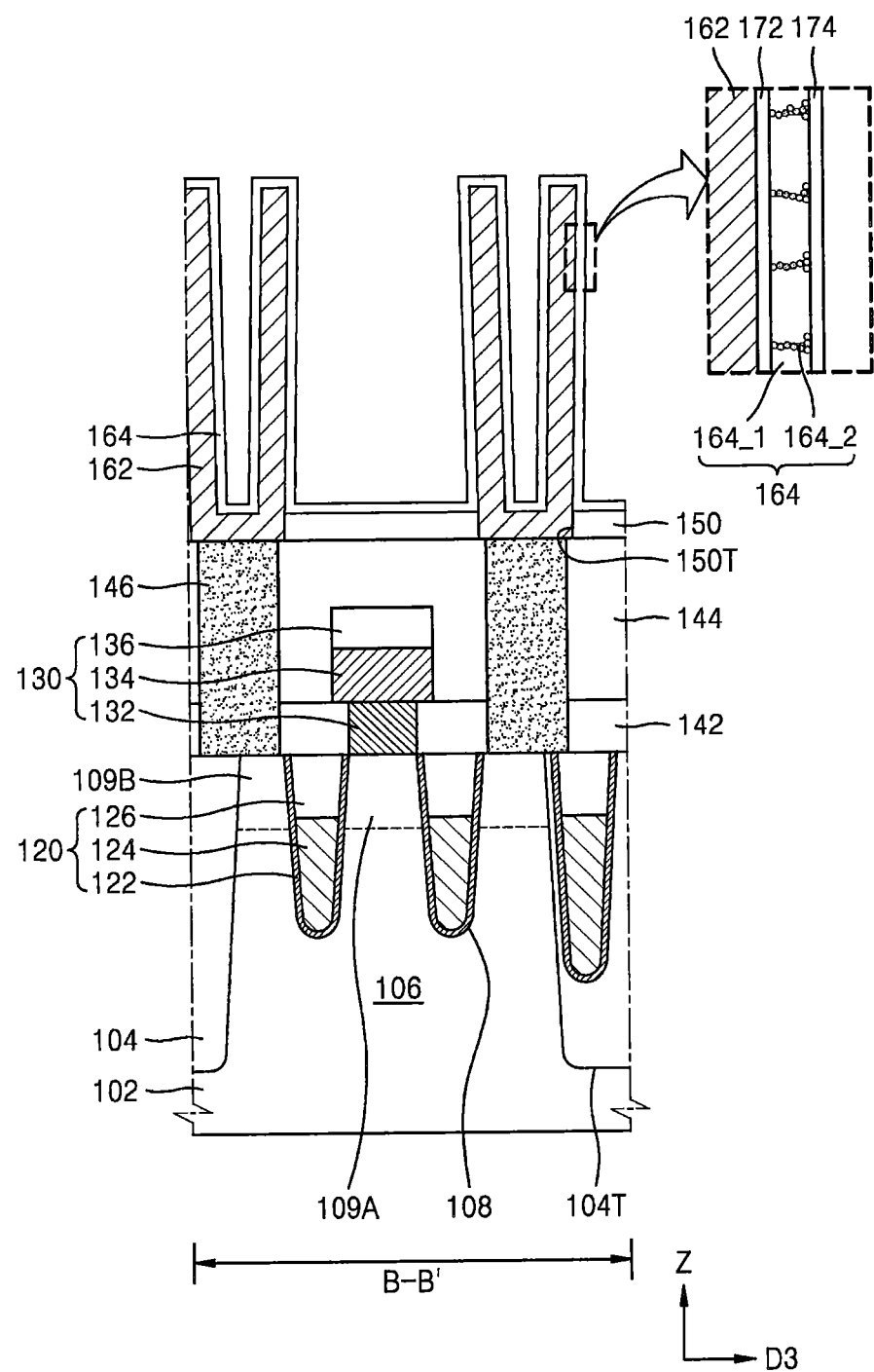

Referring to FIG. 18H, a capacitor dielectric layer 164 may be formed on the etch stop layer 150 and the lower electrode 162. The capacitor dielectric layer 164 may be formed by a process similar to the process of forming the capacitor dielectric layer 30 as described with respect to FIGS. 8 and 9A.

In some embodiments, the capacitor dielectric layer 164 may include a base layer 164_1 (refer to FIG. 6B) and a dielectric particle layer 164_2 (refer to FIG. 6B) at least partially continuously extending along a thickness direction of the capacitor dielectric layer 164 at a grain boundary of the base layer 164_1. The dielectric particle layer 164_2 may include dielectric nanoparticles disposed in a space between crystal grains of the base layer 164_1. In some embodiments, the capacitor dielectric layer 164 may have features similar to or the same as the capacitor dielectric layers 30A, 30B, 30C and/or 30D as described with reference to FIGS. 2 to 5.

Referring again to FIG. 6B, an upper electrode 166 may be formed on the capacitor dielectric layer 164.

The semiconductor device 100 may be formed through the above-described processes.

In general, as the semiconductor device is scaled down, a diameter of the lower electrode 162 may be reduced and an aspect ratio of the lower electrode 162 may be increased. Further, the capacitor dielectric layer 164 that is conformally formed on an inner wall of the lower electrode 164 may be thinner. As described above with reference to FIGS. 1 to 5, since the capacitor dielectric layer 164 includes the base layer 164_1 and the dielectric particle layer 164_2, the capacitor dielectric layer 164 may have a high capacitance even at a relatively small thickness. Additionally, the capacitor dielectric layer 164 may have a low surface roughness, and thus a short circuit or a leakage current between the upper and lower electrodes 166 and 162 through the capacitor dielectric layer 164 may be reduced or prevented from occurring.

FIGS. 19A to 19E are cross-sectional views illustrating operations or stages of a method of manufacturing a semiconductor device 100A according to example embodiments of the inventive concepts. The manufacturing method may be a method of manufacturing the semiconductor device 100A as described with reference to FIG. 7.

First, by performing the process as described with reference to FIGS. 18A to 18C, a structure in which a second insulating interlayer 144 and a contact structure 146 is formed may be obtained.

Figure 19A:
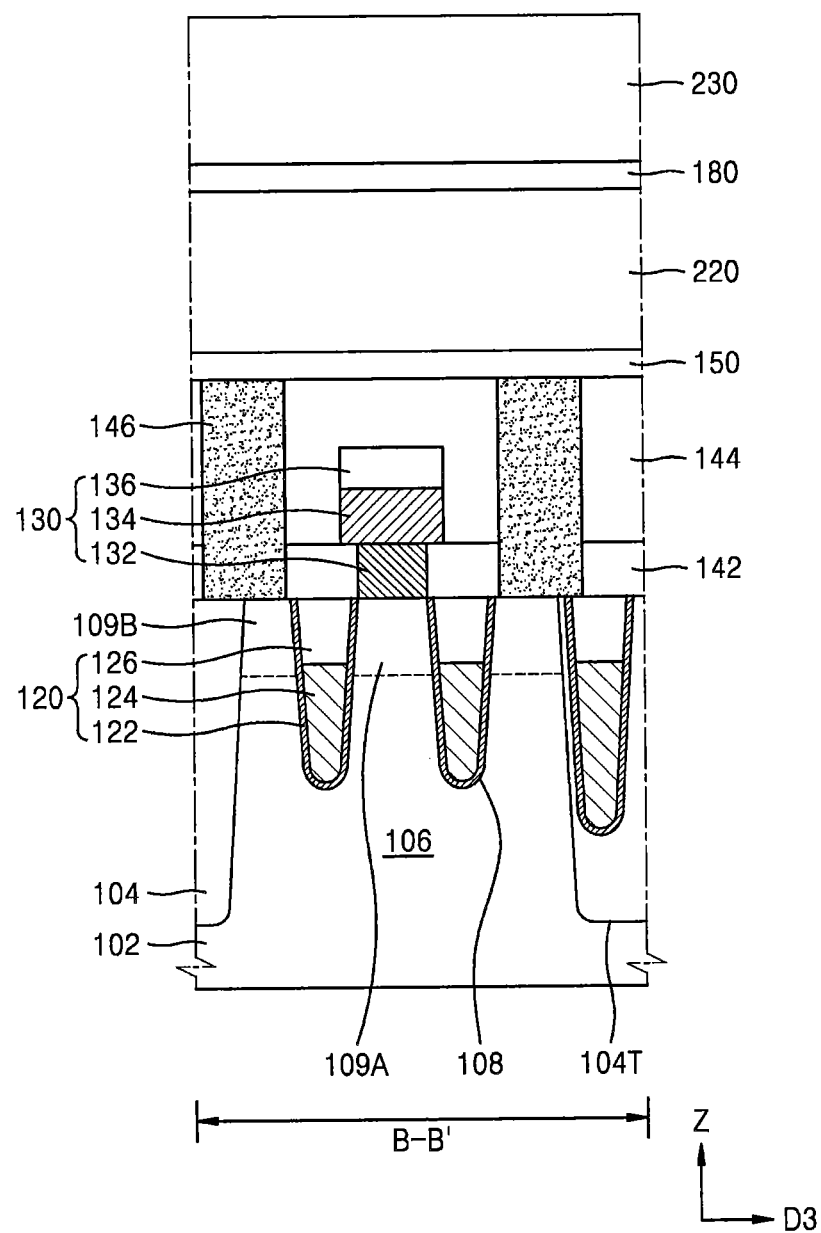
FIGS. 19A to 19E are cross-sectional views illustrating operations or stages of a method of manufacturing a semiconductor device according to example embodiments of the inventive concepts.

Referring to FIG. 19A, an etch stop layer 150, a first mold layer 220, a supporting member 180 and a second mold layer 230 may be sequentially formed on the second insulating interlayer 144 and the contact structure 146.

In some embodiments, the first and second mold layers 220 and 230 and the etch stop layer 150 may include materials having an etch selectivity with respect to each other. Further, the first and second mold layers 220 and 230 and the supporting member 180 may include materials having an etch selectivity with respect to each other. The first and second mold layers 220 and 230 may include the same material or different materials. For example, the first and second mold layers 220 and 230 may include silicon oxide, and the etch stop layer 150 and the supporting member 180 may include silicon nitride.

Figure 19B:
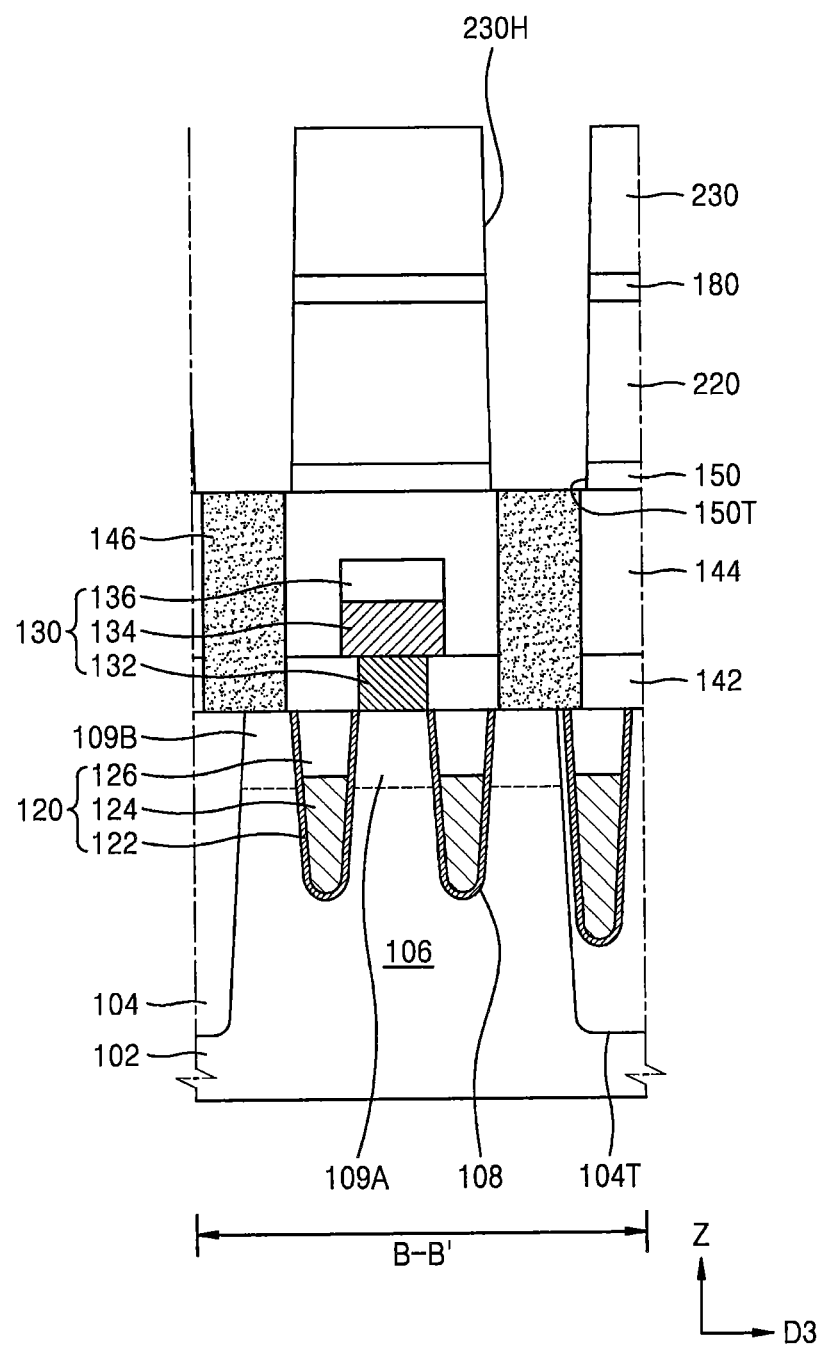

Referring to FIG. 19B, an opening 230H penetrating the second mold layer 230, the supporting member 180 and the first mold layer 220 and an opening 150T penetrating the etch stop layer 150 may be sequentially formed. The openings 230H and 150T may be integrally connected to each other and may expose a top surface of the contact structure 146. A side wall of the supporting member 180 may be exposed on an inner wall of the opening 230H.

Figure 19C:
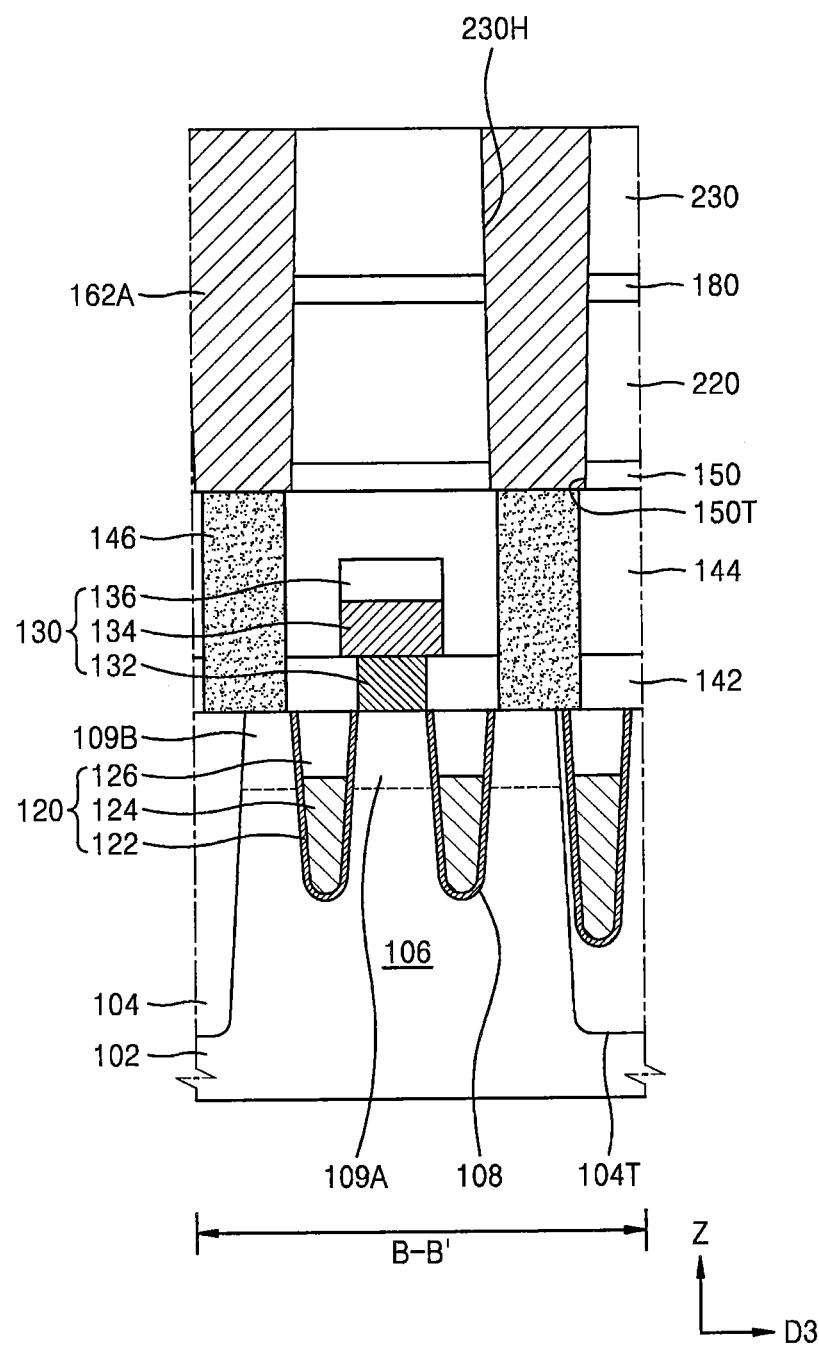

Referring to FIG. 19C, a lower electrode layer may be formed on the second mold layer 230 to fill the openings 150T and 230H, and then an upper portion of lower electrode layer may be etched-back to expose a top surface of the second mold layer 230 such that a lower electrode 162A may be formed in the openings 150T and 230H.

The lower electrode 162A may be formed in a pillar shape filling the openings 150T and 230H. A sidewall of the lower electrode 162A may contact the supporting member 180.

Figure 19D:
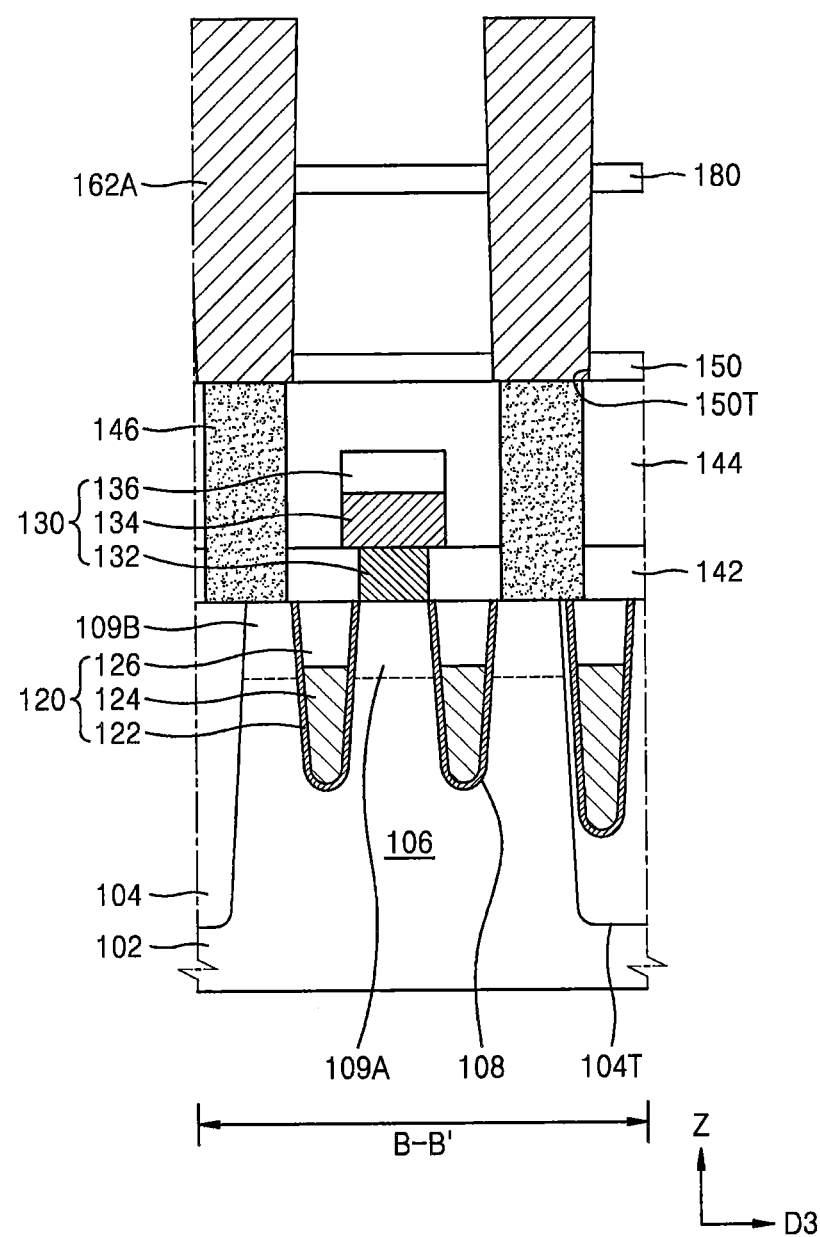

Referring to FIG. 19D, the first and second mold layers 220 and 230 may be removed.

First, the second mold layer 230 may be removed, and then after performing a patterning process for forming an opening region in the supporting member 180, the first mold layer 220 may be removed through the opening region. However, aspects of the present inventive concepts are not limited thereto. For example, during the process of forming the supporting member 180, the patterning process for forming the opening region may also be performed.

In the removal process of the first and second mold layers 220 and 230, the supporting member 180 may remain without being fully removed. The supporting member 180 may be disposed between the lower electrodes 162A, thereby preventing collapse or leaning of the lower electrode 162A.

Figure 19E:
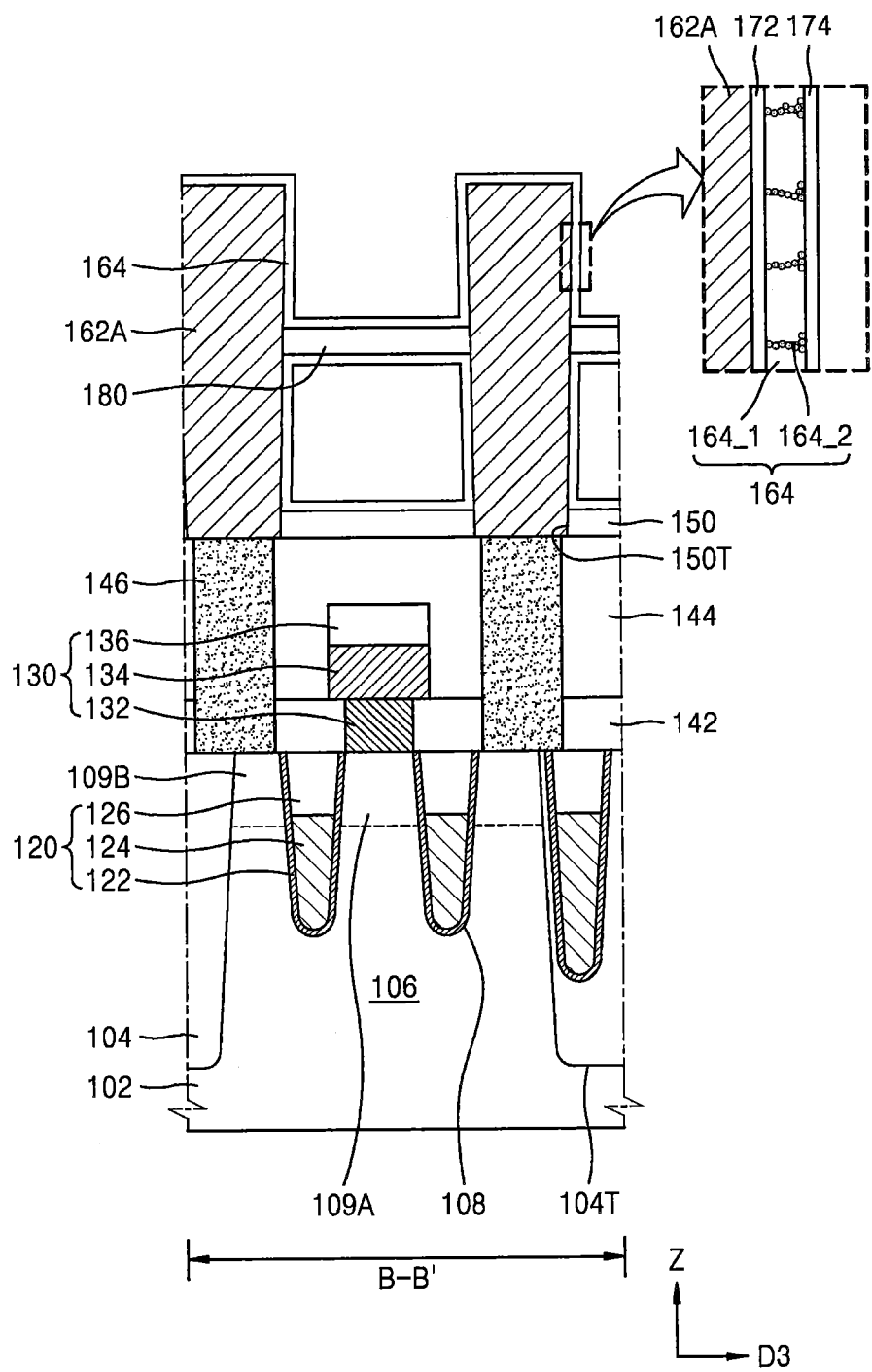

Referring to FIG. 19E, a capacitor dielectric layer 164 may be formed on the etch stop layer 150 and the lower electrode 162A. The capacitor dielectric layer 164 may also be conformally formed on the supporting member 180. The capacitor dielectric layer 164 may be formed by a process similar to the process for forming the capacitor dielectric layer 30 as described with reference to FIGS. 8 and 9A.

Referring again to FIG. 7, an upper electrode 166A may be formed on the capacitor dielectric layer 164.

The semiconductor device 100A may be formed through the above-described processes.

While the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A semiconductor device comprising:
a lower electrode on a substrate;
a capacitor dielectric layer on the lower electrode; and
an upper electrode on the capacitor dielectric layer,
wherein the capacitor dielectric layer comprises:
a base layer on the lower electrode and comprising a first dielectric material; and
a dielectric particle layer in at least a portion of the base layer, the dielectric particle layer at least partially continuously extending along a thickness direction of the capacitor dielectric layer between the lower and upper electrodes and comprising a second dielectric material different from the first dielectric material, wherein a width of a first portion of the dielectric particle layer remote from a top surface of the lower electrode is greater than a width of a second portion of the dielectric particle layer closer to the top surface of the lower electrode than the first portion.

2. The semiconductor device according to claim 1, wherein the dielectric particle layer is disposed at a grain boundary of the base layer.

3. The semiconductor device according to claim 1, wherein the dielectric particle layer fills at least a portion of a space between crystal grains of the base layer between the upper electrode and the lower electrode.

4. The semiconductor device according to claim 1, wherein the dielectric particle layer does not cover at least a portion of a top surface of the base layer.

5. The semiconductor device according to claim 1, wherein the surface roughness of the capacitor dielectric layer is 0.3 nm or less.

6. The semiconductor device according to claim 1, wherein the dielectric particle layer extends over an entire thickness of the base layer from a top surface of the base layer to a bottom surface of the base layer.

7. The semiconductor device according to claim 1, wherein the dielectric particle layer comprises dielectric nanoparticles that are dispersed along the thickness direction of the capacitor dielectric layer.

8. The semiconductor device according to claim 1, wherein the dielectric particle layer has a pillar shaped cross-section continuously extending along the thickness direction of the capacitor dielectric layer.

9. The semiconductor device according to claim 1, wherein the second dielectric material comprises one or more material of $Al_2O_3$, BeO, $B_2O_3$, $SiO_2$, $Sc_2O_3$, $Y_2O_3$, $La_2O_3$, AlN, BN and $Si_3N_4$.

10. The semiconductor device according to claim 1, further comprising a dielectric capping layer conformally disposed between the base layer and the upper electrode, the dielectric capping layer contacting the dielectric particle layer.

11. The semiconductor device according to claim 1, wherein the capacitor dielectric layer further comprises a second base layer on the base layer and the dielectric particle layer and a second dielectric particle layer in the second base layer, and wherein the second base layer comprises the first dielectric material and the second dielectric particle layer comprises the second dielectric material.

12. A semiconductor device comprising;
a lower electrode on a substrate;
a capacitor dielectric layer on the lower electrode and having a surface roughness of 0.3 nm or less, and
an upper electrode on the capacitor dielectric layer,
wherein the capacitor dielectric layer comprises;
a base layer on the lower electrode and comprising a first dielectric material; and
a dielectric particle layer in at least a portion of the base layer, the dielectric particle layer at least partially continuously extending along a thickness direction of the capacitor dielectric layer between the lower and upper electrodes and comprising a second dielectric material different from the first dielectric material.

13. The semiconductor device according to claim 12, wherein the dielectric particle layer contacts a grain boundary of the base layer and extends along the thickness direction of the capacitor dielectric layer.

14. The semiconductor device according to claim 12, wherein the dielectric particle layer fills a space between crystal grains of the base layer.

15. A semiconductor device comprising;
a first electrode;
a second electrode; and
a capacitor dielectric layer comprising a base layer extending between the first and second electrodes to define a thickness thereof, and a dielectric particle layer extending within the base layer along the thickness thereof, the base layer comprising a dielectric material that is different from a dielectric material of the dielectric particle layer, wherein the base layer defines a first sub-domain having a first capacitance and the dielectric particle layer defines a second sub-domain having a second capacitance, wherein the first and second sub-domains are connected in parallel.

16. The semiconductor device according to claim 15, wherein the base layer comprises a first base layer and a second base layer that are stacked between the first and second electrodes to define the thickness, wherein the second base layer has a greater crystallinity than the first base layer, and wherein the dielectric particle layer extends along the thickness from the second base layer into the first base layer.

17. The semiconductor device according to claim 16, wherein a portion of the first base layer opposite the second base layer is free of the dielectric particle layer.

18. The semiconductor device according to claim 15, wherein the dielectric particle layer comprises dielectric nanoparticles dispersed along grain boundaries defined between adjacent crystal grains of the base layer.

* * * * *